(12) United States Patent
Yonemura et al.

(10) Patent No.: US 8,608,290 B2
(45) Date of Patent: Dec. 17, 2013

(54) LIQUID EJECTING HEAD AND LIQUID EJECTING APPARATUS

(75) Inventors: Takayuki Yonemura, Suwa (JP);
Masahisa Nawano, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 199 days.

(21) Appl. No.: 13/046,658

(22) Filed: Mar. 11, 2011

(65) Prior Publication Data

US 2011/0220734 A1    Sep. 15, 2011

(30) Foreign Application Priority Data

Mar. 12, 2010    (JP) ................ 2010-056803

(51) Int. Cl.
     *B41J 2/045*      (2006.01)
(52) U.S. Cl.
     USPC ........................................... 347/68
(58) Field of Classification Search
     None
     See application file for complete search history.

(56) References Cited

U.S. PATENT DOCUMENTS

| | | | |
|---|---|---|---|
| 8,419,967 | B2 | 4/2013 | Sasaki et al. |
| 2002/0003247 | A1 | 1/2002 | Yokoyama et al. |
| 2005/0097716 | A1 | 5/2005 | Takakuwa et al. |
| 2007/0090728 | A1 | 4/2007 | Matsuda et al. |
| 2010/0192842 | A1 | 8/2010 | Sasaki et al. |
| 2011/0143146 | A1 * | 6/2011 | Harigai et al. ............ 428/446 |

FOREIGN PATENT DOCUMENTS

| | | | |
|---|---|---|---|
| CN | 85100426 A | * | 8/1986 |
| EP | 1 585 180 A2 | | 10/2005 |
| JP | 2001-223404 A | | 8/2001 |
| JP | 2009-137133 A | | 6/2009 |
| JP | 2009-224740 A | | 10/2009 |
| JP | 2009-267364 A | | 11/2009 |
| JP | 2010-043353 A | | 2/2010 |

* cited by examiner

*Primary Examiner* — Matthew Luu
*Assistant Examiner* — Erica Lin
(74) *Attorney, Agent, or Firm* — Kilpatrick Townsend & Stockton LLP

(57) ABSTRACT

A liquid ejecting head includes a plate which is composed of a material containing silicon, a titanium oxide layer which is disposed above the plate, a bismuth-containing layer which is disposed above the titanium oxide layer and contains bismuth, a first electrode which is disposed above the bismuth-containing layer and composed of platinum, a piezoelectric layer which is disposed above the first electrode and composed of a piezoelectric material containing at least bismuth, and a second electrode which is disposed above the piezoelectric layer.

7 Claims, 20 Drawing Sheets

LIQUID EJECTING HEAD AND LIQUID EJECTING APPARATUS

CROSS-REFERENCE TO RELATED APPLICATIONS

This application claims the benefit of priority to Japanese Patent Application No. 2010-056803 filed Mar. 12, 2010, the contents of which are hereby incorporated by reference in their entirety.

BACKGROUND

1. Technical Field

The present invention relates to a liquid ejecting head including a piezoelectric element which causes a change in pressure in a pressure-generating chamber communicating with a nozzle opening and which has a piezoelectric layer and an electrode that applies a voltage to the piezoelectric layer, and also relates to a liquid ejecting apparatus.

2. Related Art

Piezoelectric elements used for liquid ejecting heads, for example, have a structure in which a piezoelectric layer composed of a piezoelectric material having an electromechanical conversion function, such as a crystallized dielectric material, is interposed between two electrodes. Such piezoelectric elements are mounted, for example, as actuator devices having a flexural vibration mode, in liquid ejecting heads. A typical example of liquid ejecting heads is an ink jet recording head in which a part of a pressure-generating chamber is made of a vibration plate, the pressure-generating chamber communicating with a nozzle opening that ejects ink droplets, and by deforming the vibration plate by a piezoelectric element, ink in the pressure-generating chamber is pressed so as to be ejected as ink droplets from the nozzle opening.

The piezoelectric material used for the piezoelectric layer (piezoelectric ceramic) constituting such a piezoelectric element is required to have high piezoelectricity, and a typical example thereof is lead zirconate titanate (PZT) (refer to JP-A-2001-223404).

However, from the standpoint of environmental concerns, a piezoelectric material having a reduced content of lead has been desired. Examples of a lead-free piezoelectric material include $BiFeO_3$ having a perovskite structure represented by $ABO_3$. When a $BiFeO_3$-based piezoelectric material is used, a problem may occur in which bismuth contained in the piezoelectric material diffuses into a vibration plate, thus adversely affecting the vibration plate composed of a material containing silicon. In addition, such a problem occurs not only in ink jet recording heads that eject ink, but also in liquid ejecting heads that eject droplets other than ink.

SUMMARY

An advantage of some aspects of the invention is that the invention provides a liquid ejecting head and a liquid ejecting apparatus in which bismuth is prevented from diffusing into a vibration plate, and the environmental load is reduced.

According to a first aspect of the invention, a liquid ejecting head includes a passage-forming substrate provided with a pressure-generating chamber communicating with a nozzle opening, a vibration plate which is disposed on the passage-forming substrate and composed of a material containing silicon, a titanium oxide layer which is disposed on the vibration plate, a bismuth-containing layer which is disposed on the titanium oxide layer and contains bismuth, a first electrode which is disposed on the bismuth-containing layer and composed of platinum, a piezoelectric layer which is disposed on the first electrode and composed of a piezoelectric material containing at least bismuth, and a second electrode which is disposed on the piezoelectric layer.

According to the first aspect of the invention, by using a structure in which the titanium oxide layer, the bismuth-containing layer, the first electrode composed of platinum, and the piezoelectric layer containing bismuth are arranged in that order from the vibration plate side, the titanium oxide layer and the bismuth-containing layer serve as a stopper, and thereby it is possible to prevent bismuth which is contained in the piezoelectric layer and which has passed through the first electrode composed of platinum from further diffusing into the vibration plate. Furthermore, since the lead content can be reduced, the environmental load can be reduced.

Furthermore, the piezoelectric material may contain bismuth lanthanum iron manganese oxide. In this case, the piezoelectric material is prepared using bismuth lanthanum iron manganese oxide, and it is possible to realize a liquid ejecting head in which bismuth is prevented from diffusing into the vibration plate composed of a material containing silicon.

Furthermore, the piezoelectric material may contain barium titanate or bismuth potassium titanate. In this case, it is possible to obtain a liquid ejecting head provided with a piezoelectric element having excellent properties, such as high piezoelectricity (amount of strain).

Furthermore, the thickness of the bismuth-containing layer may be 10 nm or less. The bismuth-containing layer with a thickness of 10 nm or less and the titanium oxide layer disposed on the vibration plate side thereof serve as a stopper that prevents bismuth from diffusing into the vibration plate.

According to a second aspect of the invention, a liquid ejecting apparatus includes the liquid ejecting head according to the first aspect of the invention. According to the second aspect of the invention, it is possible to prevent bismuth which is contained in the piezoelectric layer and which has passed through the first electrode composed of platinum from further diffusing into the vibration plate, and therefore, a liquid ejecting apparatus having excellent ejection characteristics can be realized. Furthermore, it is possible to provide a liquid ejecting apparatus in which the lead content is reduced and the environmental load is reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
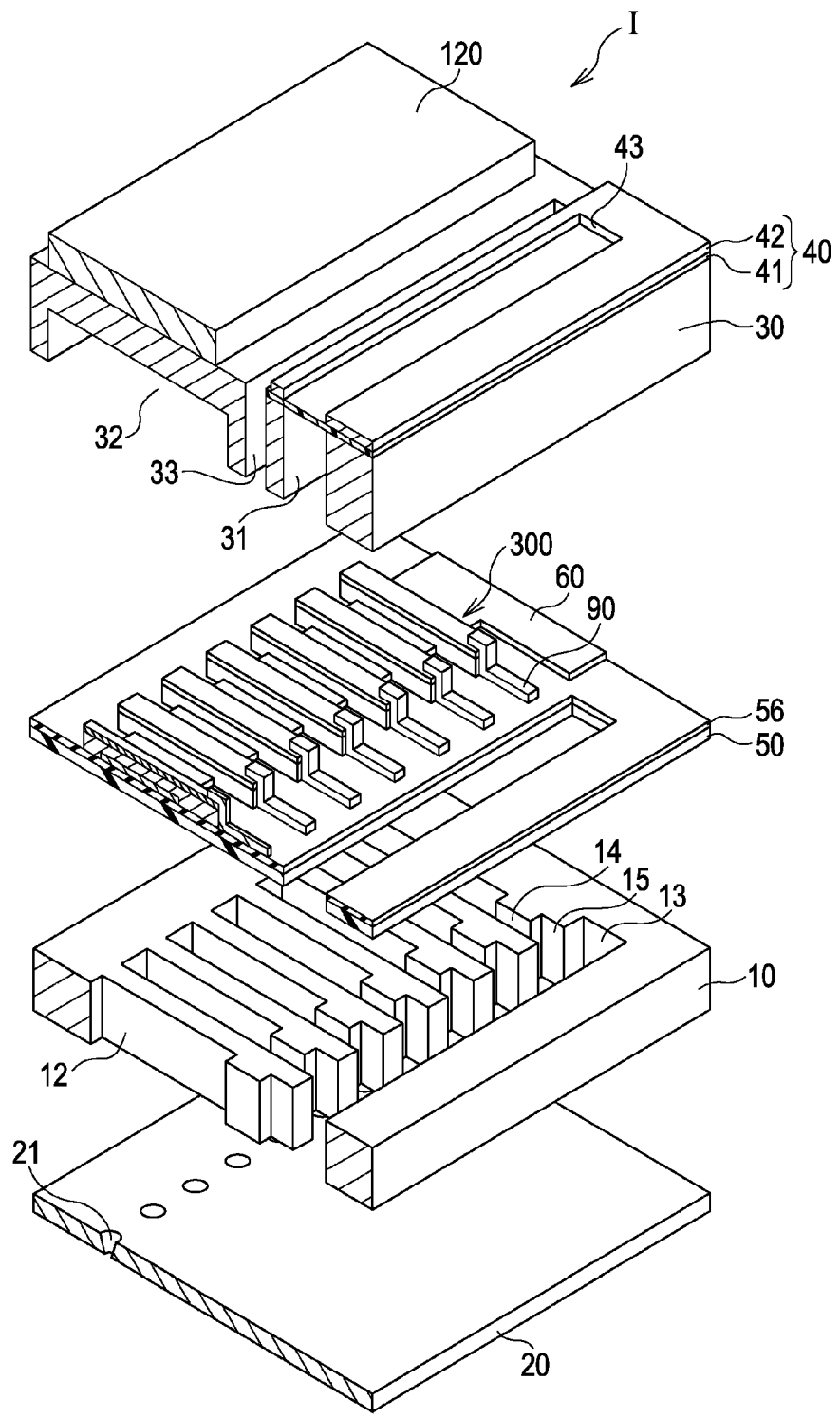
FIG. 1 is an exploded perspective view schematically showing a structure of a recording head according to a first embodiment.
Figure 2:
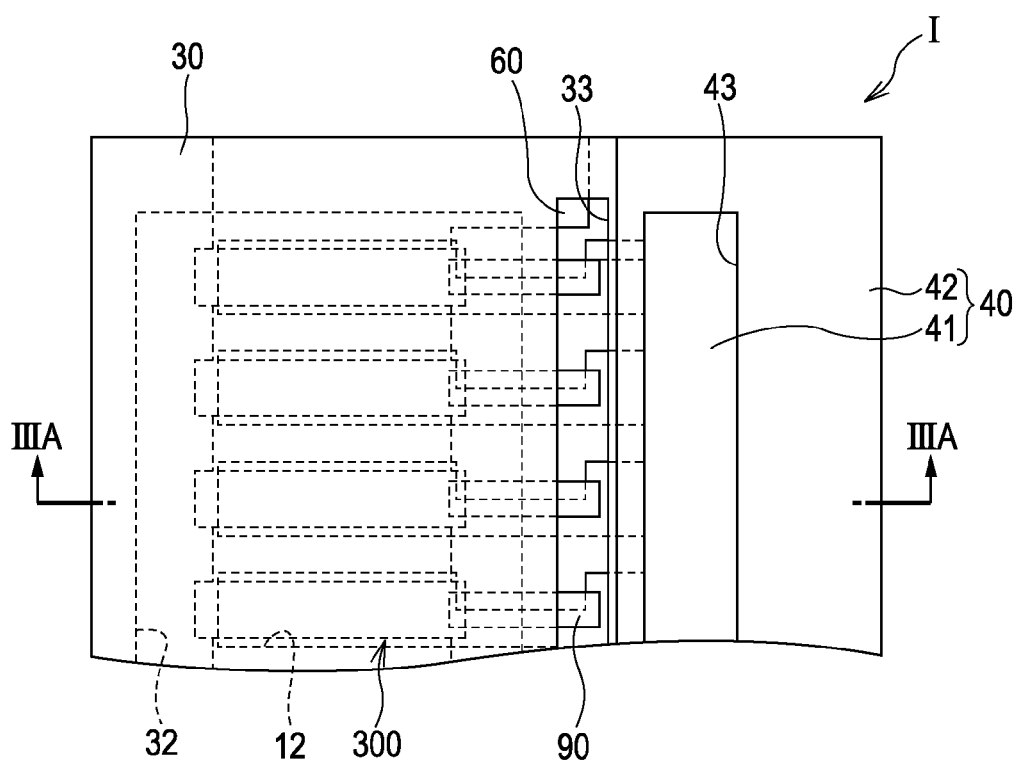
FIG. 2 is a plan view of the recording head according to the first embodiment.
Figure 3A:
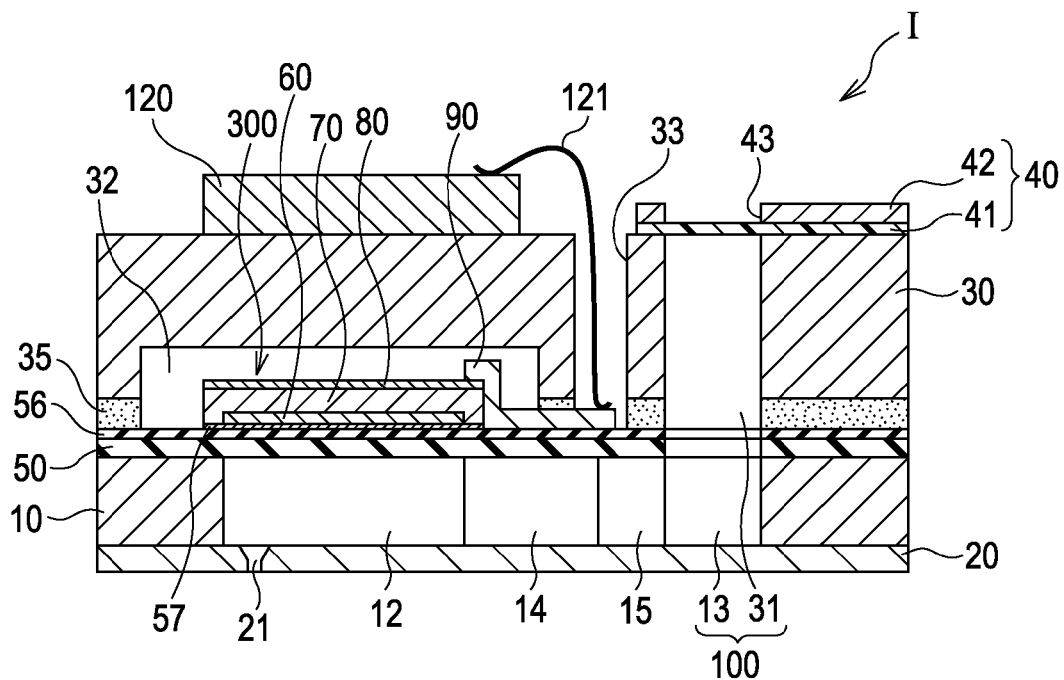
FIG. 3A is a cross-sectional view of the recording head according to the first embodiment.
Figure 3B:
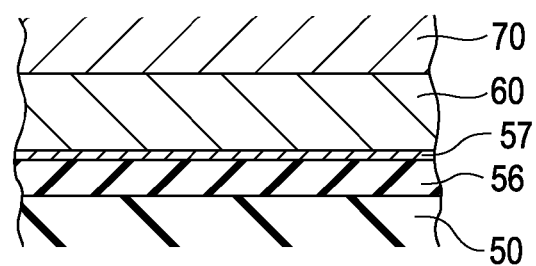
FIG. 3B is an enlarged cross-sectional view showing a main portion of the recording head shown in FIG. 3A.
Figure 4:
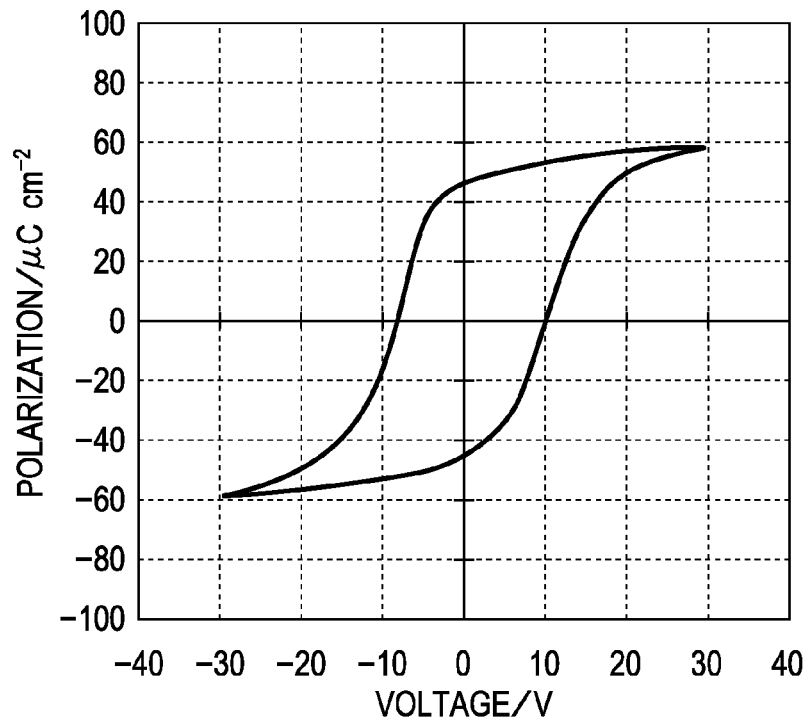
FIG. 4 is a graph showing a P-V curve of Sample 1.
Figure 5:
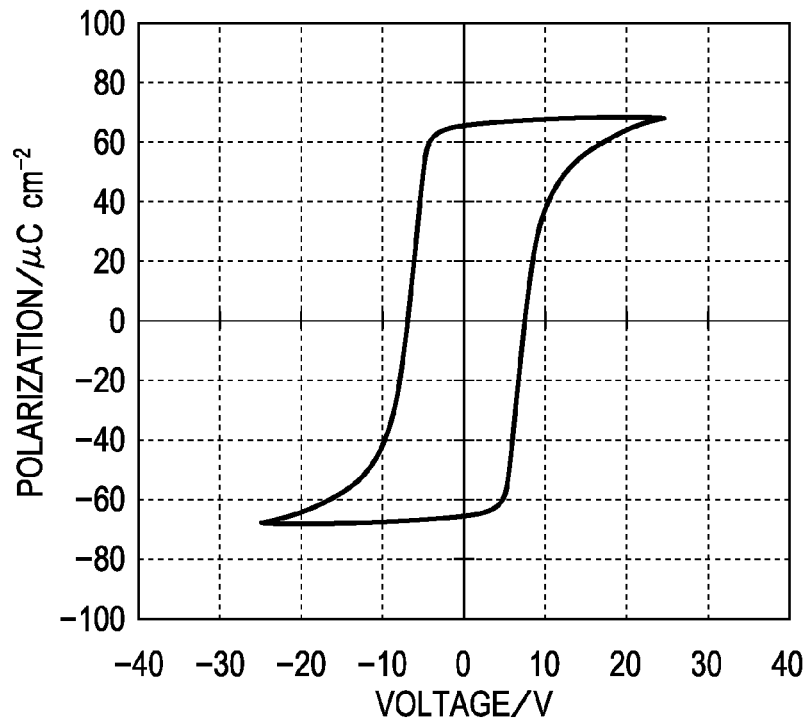
FIG. 5 is a graph showing a P-V curve of Sample 2.
Figure 6:
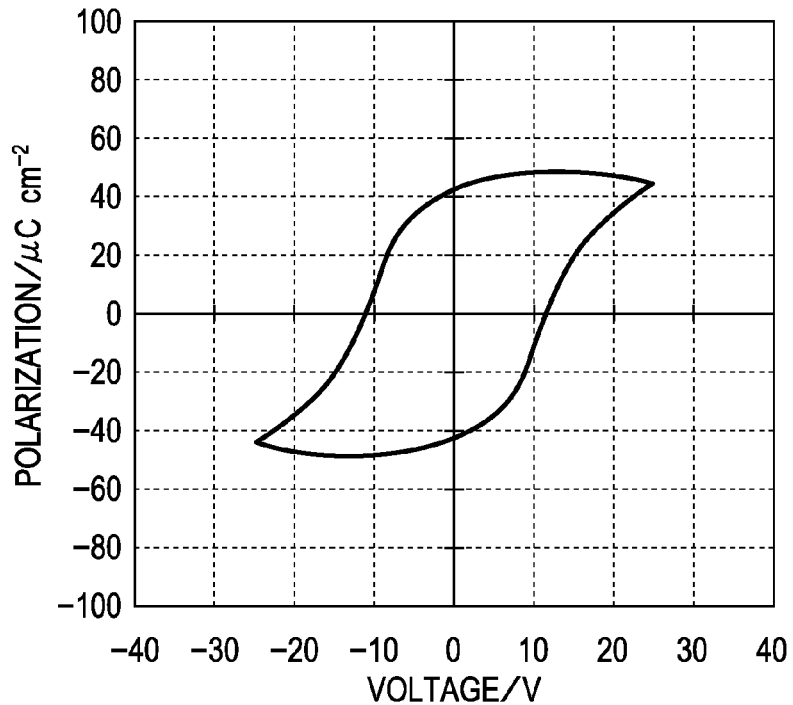
FIG. 6 is a graph showing a P-V curve of Sample 3.
Figure 7:
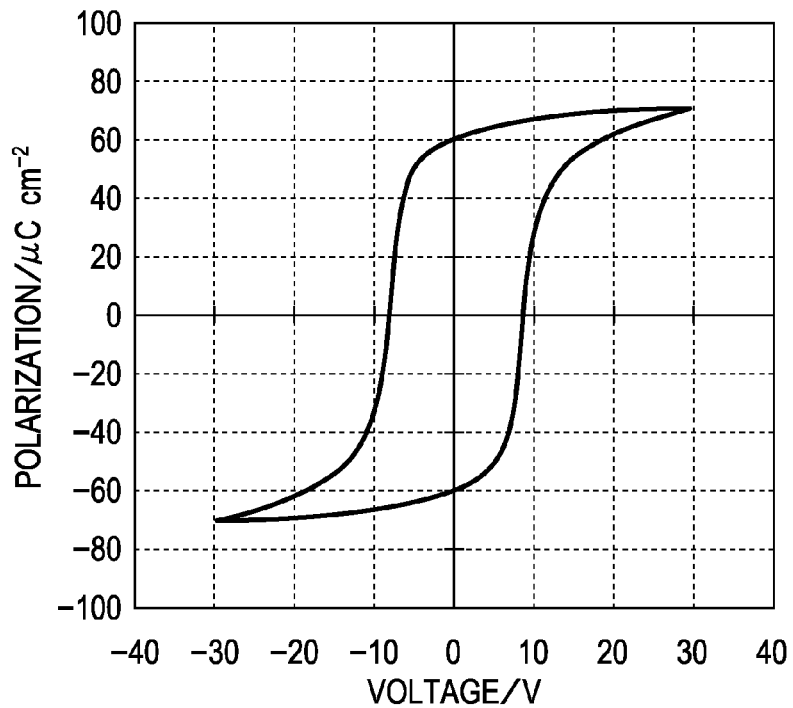
FIG. 7 is a graph showing a P-V curve of Sample 4.
Figure 8:
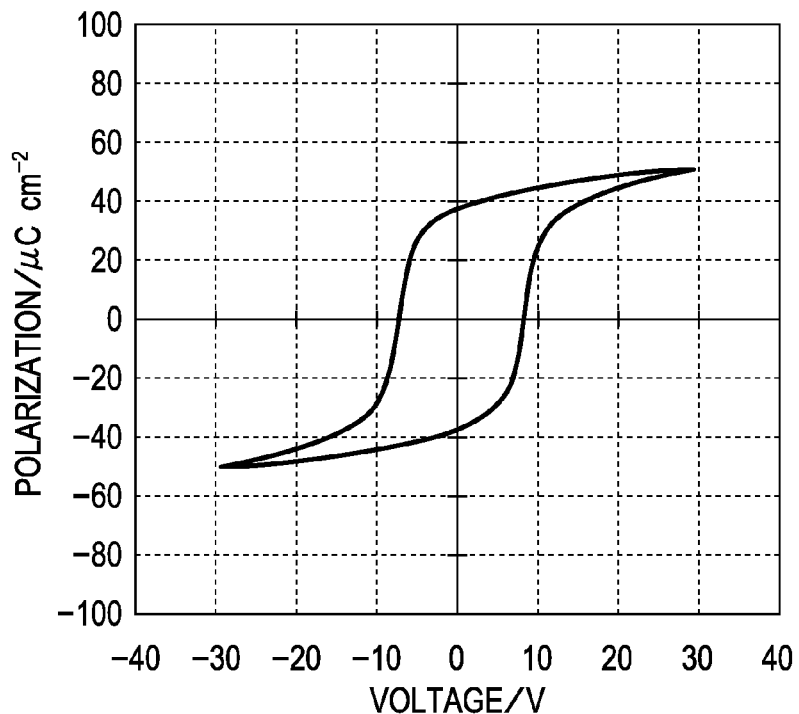
FIG. 8 is a graph showing a P-V curve of Sample 5.
Figure 9:
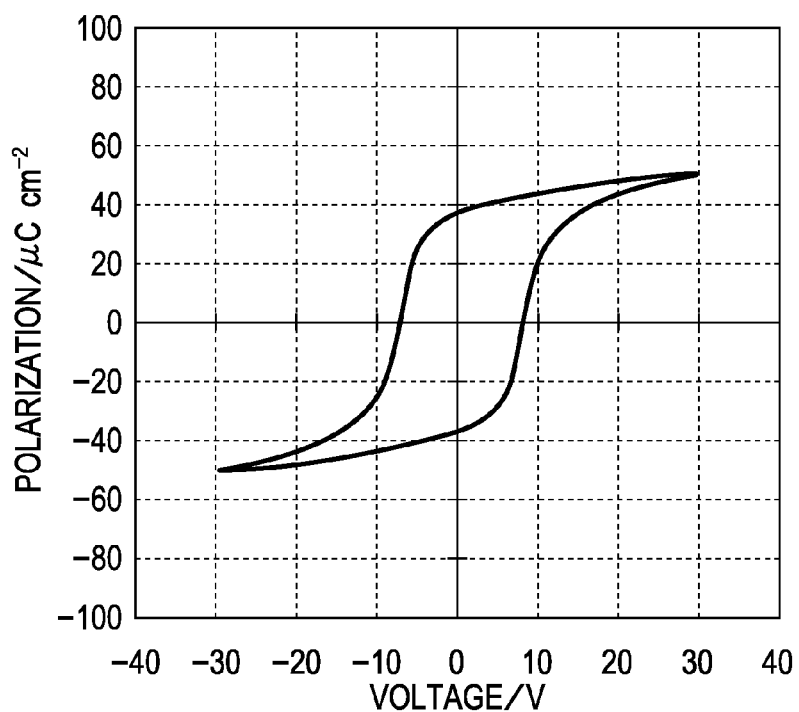
FIG. 9 is a graph showing a P-V curve of Sample 6.
Figure 10:
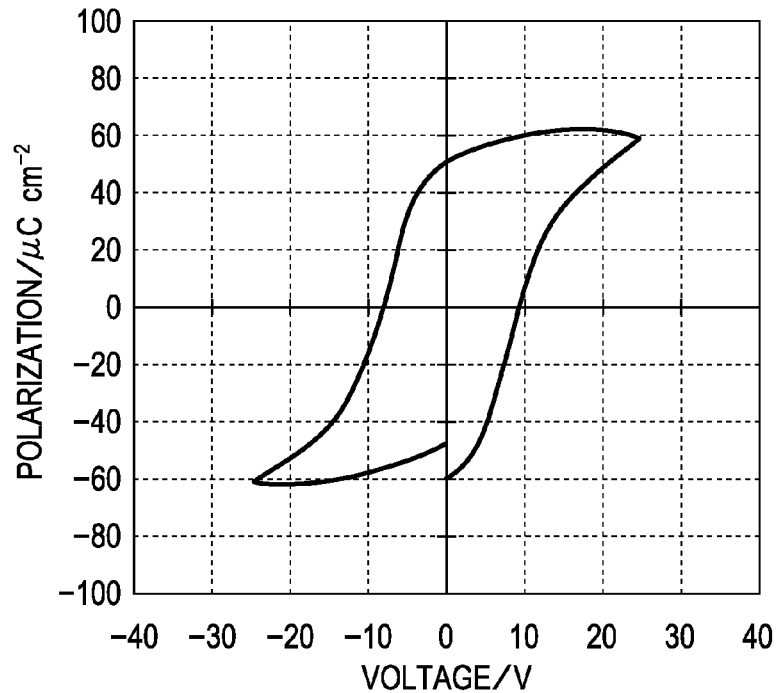
FIG. 10 is a graph showing a P-V curve of Sample 7.
Figure 11:
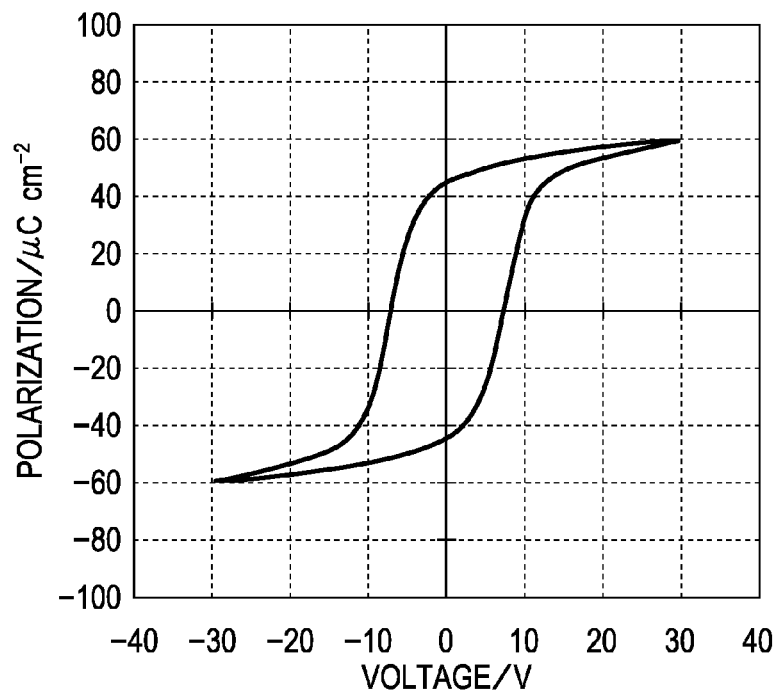
FIG. 11 is a graph showing a P-V curve of Sample 8.
Figure 12:
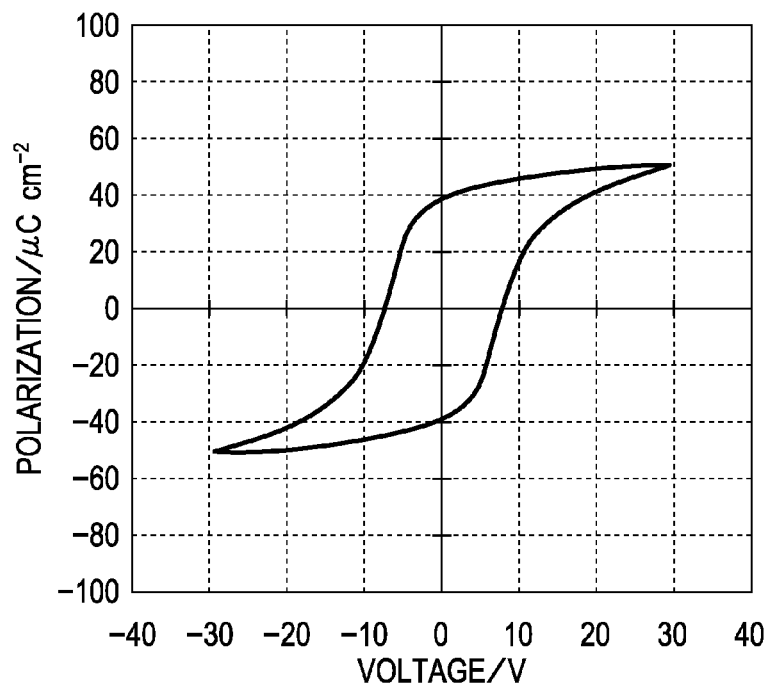
FIG. 12 is a graph showing a P-V curve of Sample 9.
Figure 13:
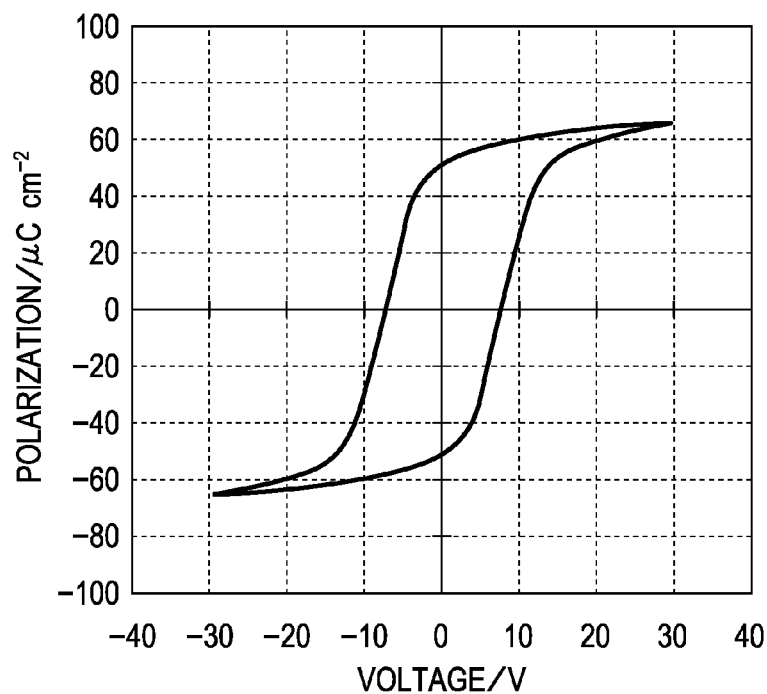
FIG. 13 is a graph showing a P-V curve of Sample 10.
Figure 14:
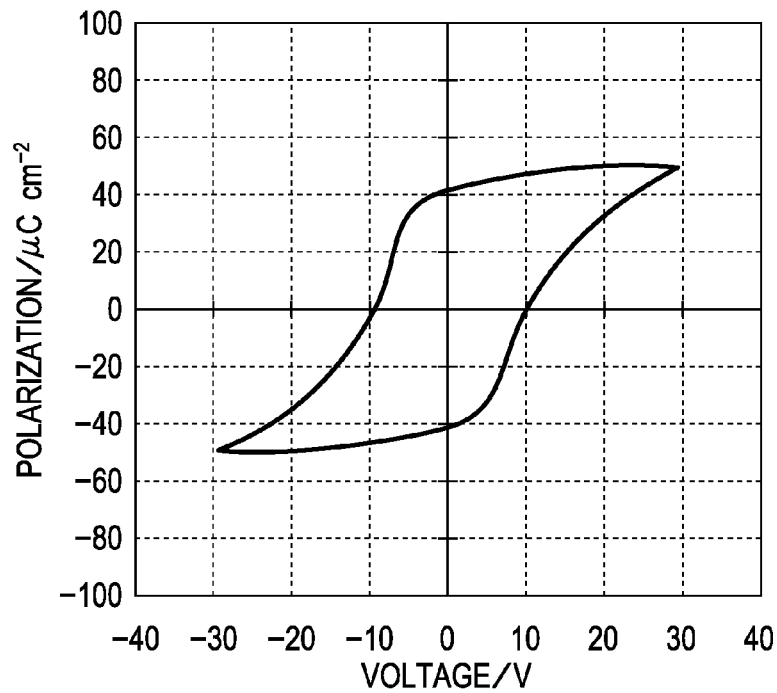
FIG. 14 is a graph showing a P-V curve of Sample 11.

FIG. 1 is an exploded perspective view schematically showing a structure of an ink jet recording head, which is an example of a liquid ejecting head according to a first embodiment of the invention. FIG. 2 is a plan view of the recording head shown in FIG. 1. FIG. 3A is a cross-sectional view taken along the line IIIA-IIIA in FIG. 2, and FIG. 3B is an enlarged cross-sectional view showing a main portion of the recording head shown in FIG. 3A. As shown in FIGS. 1 to 3B, a passage-forming substrate 10 according to this embodiment is made of a silicon single crystal substrate, and an elastic film 50, which is composed of silicon dioxide and constitutes a vibration plate, is disposed on one surface thereof. The material for the elastic film 50 is not limited to silicon dioxide, but may be a silicon-based material, i.e., a material containing silicon.

A plurality of pressure-generating chambers 12 are disposed in parallel in a width direction of the passage-forming substrate 10. A communicating portion 13 is provided in the passage-forming substrate 10 in a region located outside in the longitudinal direction of the pressure-generating chambers 12. The communicating portion 13 communicates with the pressure-generating chambers 12 through ink supply passages 14 and communicating passages 15 provided for the corresponding pressure-generating chambers 12. The communicating portion 13 communicates with a reservoir portion 31 of a protective substrate, which will be described below, to constitute a reservoir that serves as a common ink chamber for the pressure-generating chambers 12. The ink supply passages 14 have a smaller width than that of the pressure-generating chambers 12 so that the flow passage resistance to ink flowing from the communicating portion 13 to the pressure-generating chambers 12 can be maintained constant. In this embodiment, the ink supply passages 14 are formed by shortening the width of flow passages from one side. However, the ink supply passages may be formed by shortening the width of flow passages from both sides. Furthermore, ink supply passages may be formed by shortening the thickness of the flow passages instead of shortening the width of the flow passages. In this embodiment, the passage-forming substrate 10 is provided with liquid flow passages constituted by the pressure-generating chambers 12, the communicating portion 13, the ink supply passages 14, and the communicating passages 15.

Furthermore, a nozzle plate 20 is fixed, by an adhesive, a thermally weldable film, or the like, to the opening surface side of the passage-forming substrate 10. The nozzle plate 20 has nozzle openings 21 formed by punching, each nozzle opening 21 communicating with the pressure-generating chamber 12 at a vicinity of an end opposite the corresponding ink supply passage 14. The nozzle plate 20 is composed of, for example, glass ceramic, a silicon single crystal substrate, or stainless steel.

Meanwhile, as described above, the elastic film 50 is disposed on a surface opposite the opening surface of the passage-forming substrate 10, and a titanium oxide layer 56 composed of titanium oxide, for example, with a thickness of about 30 to 50 nm, is disposed on the elastic film 50. Although a detailed description will be made later, the titanium oxide layer 56 is not formed by a method in which a layer composed of titanium is provided and the layer composed of titanium is converted to titanium oxide in the process of firing a piezoelectric precursor film disposed on the layer composed of titanium, but by a method in which a layer composed of titanium oxide is formed before a piezoelectric precursor film is disposed thereon. In addition, as necessary, an insulating film composed of zirconium oxide or the like may be formed between the elastic film 50 and the titanium oxide layer 56.

A bismuth-containing layer 57 which contains bismuth and has a thickness, for example, of 10 nm or less is further disposed on the titanium oxide layer 56. The bismuth-containing layer 57 is not particularly limited as long as it contains bismuth. For example, the bismuth-containing layer 57 may be composed of a compound containing titanium and bismuth.

A first electrode 60 composed of platinum, a piezoelectric layer 70, which is a thin film, for example, with a thickness of 2 μm or less, preferably 1 to 0.3 μm, and which is formed by a chemical solution method, the detail of which will be described later, and a second electrode 80 are stacked on the bismuth-containing layer 57 to constitute a piezoelectric element 300. Here, the piezoelectric element 300 refers to a portion including the first electrode 60, the piezoelectric layer 70, and the second electrode 80. In general, one of the electrodes of the piezoelectric element 300 is formed as a common electrode, and the other electrode and the piezoelectric layer 70 are subjected to patterning for each pressure-generating chamber 12. In this embodiment, the first electrode 60 is a common electrode of the piezoelectric element 300 and the second electrode 80 is an individual electrode of the piezoelectric element 300. However, no problem occurs even if this is reversed because of the driving circuit or wiring. In this embodiment, the piezoelectric element 300 and the vibration plate in which displacement is caused by driving of the piezoelectric element 300 in combination are referred to as an actuator device.

In accordance with the embodiment of the invention, the piezoelectric layer 70 is composed of a piezoelectric material which has a perovskite structure and contains bismuth (Bi), for example, a piezoelectric material containing Bi and iron (Fe). In the perovskite structure, i.e., the $ABO_3$ type structure, the A site is coordinated by twelve oxygen atoms, and the B site is coordinated by six oxygen atoms to form an octahedron. Bi is located at the A site, and Fe is located at the B site.

In the case where the piezoelectric material constituting the piezoelectric layer 70 contains Bi, in the existing art, Bi contained in the piezoelectric material passes through the first electrode 60 composed of platinum and diffuses into the elastic film 50, i.e., the vibration plate composed of a material containing silicon, resulting in changes in displacement characteristics and durability of the vibration plate, which degrades ejection characteristics of ink or the like. In this embodiment, by using a structure in which the titanium oxide layer 56, the bismuth-containing layer 57, the first electrode 60 composed of platinum, and the piezoelectric layer 70 containing Bi are arranged in that order from the vibration plate (elastic film 50) side, the vibration plate being composed of a material containing silicon, it is possible to prevent Bi from diffusing into the vibration plate (elastic film 50), and a vibration plate composed of a material containing silicon but not containing Bi can be obtained.

As the piezoelectric material which constitutes the piezoelectric layer 70 and which has the perovskite structure and contains Bi and Fe, for example, bismuth iron manganese oxide, bismuth lanthanum iron manganese oxide, or the like having the perovskite structure may be mentioned.

Figure 15:
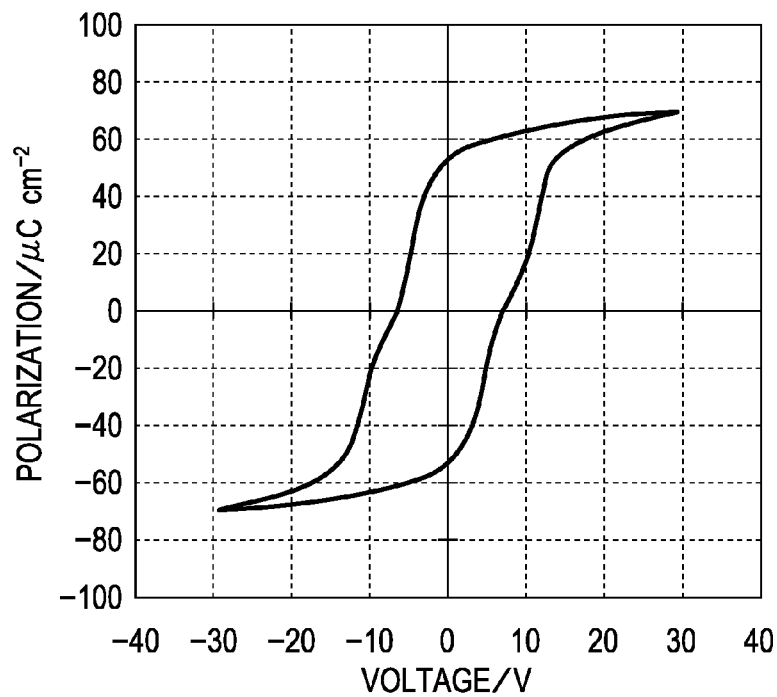
FIG. 15 is a graph showing a P-V curve of Sample 12.
Figure 16:
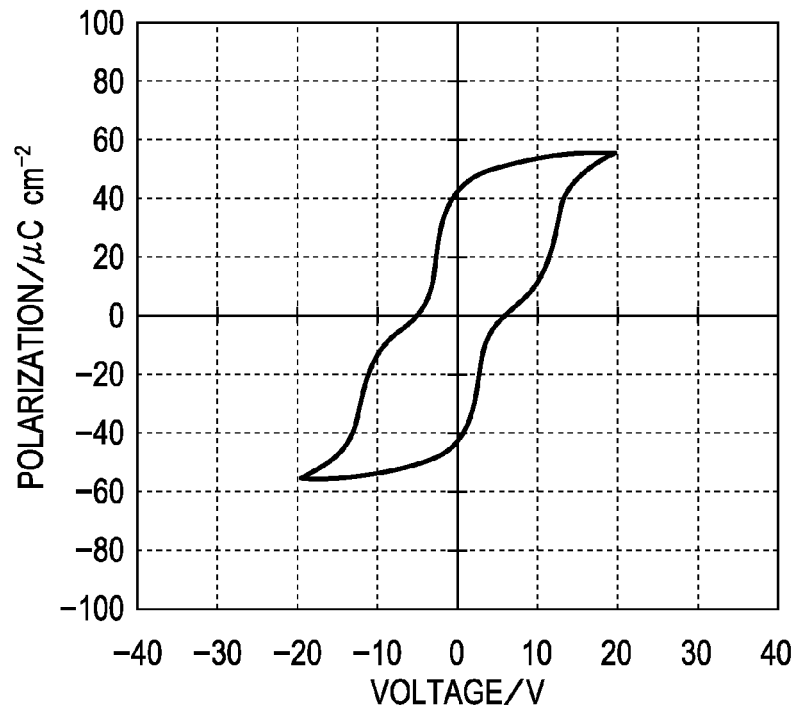
FIG. 16 is a graph showing a P-V curve of Sample 13.
Figure 17:
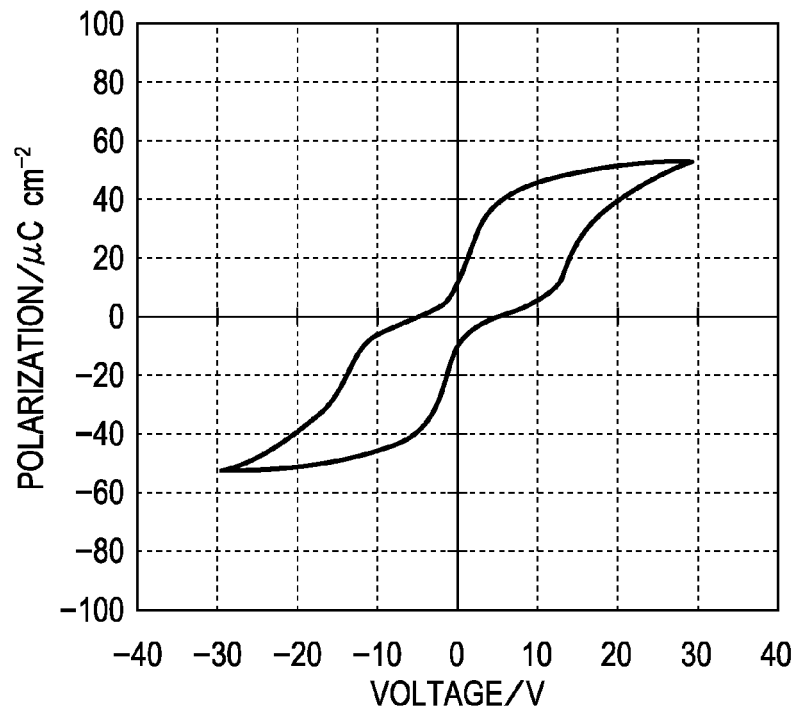
FIG. 17 is a graph showing a P-V curve of Sample 14.
Figure 18:
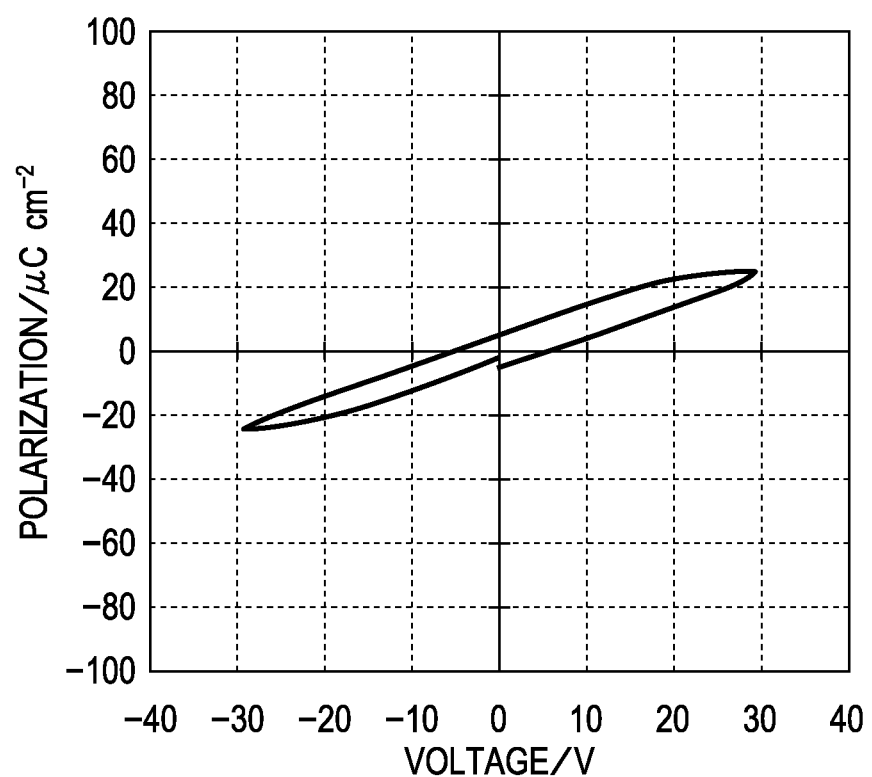
FIG. 18 is a graph showing a P-V curve of Sample 15.

In the bismuth lanthanum iron manganese oxide having the perovskite structure, i.e., a composite oxide containing bismuth (Bi), lanthanum (La), iron (Fe), and manganese (Mn) and having the perovskite structure, Bi and La are located at the A site, and Fe and Mn are located at the B site. Preferably, the bismuth lanthanum iron manganese oxide has a compositional ratio represented by general formula (1) below. Note that, in general formula (1), by satisfying the range of $0.10 \leq x \leq 0.20$, it is possible to make the piezoelectric layer 70 be a ferroelectric substance. When the piezoelectric layer 70 is ferroelectric, the amount of strain can be controlled easily. Consequently, in the case where the piezoelectric element is used for a liquid ejecting head or the like, the size of ink droplets to be ejected and the like can be easily controlled. Furthermore, the composite oxide containing Bi, La, Fe, and Mn and having the perovskite structure exhibits different properties, namely, ferroelectricity, antiferroelectricity, and paraelectricity depending on the compositional ratio. Piezoelectric elements (Samples 1 to 18) were prepared in which the compositional ratio in general formula (1) below was changed. A triangular wave of 25 V or 30 V was applied to Samples 1 to 18, and the P (polarization)-V (voltage) relationship was measured. The measurement results are shown in FIGS. 4 to 18, and the compositions are shown in Table 1. Note that since Samples 16 to 18 had excessively large leakage, measurement was not possible, and the samples were found to be unusable as a piezoelectric material. As shown in FIGS. 4 to 14, in Samples 1-11 in which the ranges of $0.10 \leq x \leq 0.20$ and $0.01 \leq y \leq 0.09$ are satisfied, a hysteresis loop shape characteristic of a ferroelectric substance is observed. Consequently, in Samples 1 to 11, the amount of strain linearly changes with respect to the applied voltage, thus facilitating control of the amount of strain. On the other hand, in Samples 12 to 14 which are out of the ranges of $0.10 \leq x \leq 0.20$ and $0.01 \leq y \leq 0.09$ in general formula (1), as shown in FIGS. 15 to 17, double hysteresis characteristic of an antiferroelectric substance is observed which has two hysteresis loop shapes in the positive and negative electric field directions, and therefore, the samples are antiferroelectric. Sample 15 is paraelectric as shown in FIG. 18. Furthermore, Samples 16 to 18 are unusable as a piezoelectric material because of excessively large leakage as described above. None of Samples 12 to 18 are ferroelectric.

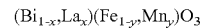

$$(Bi_{1-x},La_x)(Fe_{1-y},Mn_y)O_3 \qquad (1)$$

$(0.10 \leq x \leq 0.38, 0.01 \leq y \leq 0.09)$

TABLE 1

| | x | y |
|---|---|---|
| Sample 1 | 0.10 | 0.03 |
| Sample 2 | 0.10 | 0.05 |
| Sample 3 | 0.10 | 0.09 |
| Sample 4 | 0.14 | 0.05 |
| Sample 5 | 0.17 | 0.03 |
| Sample 6 | 0.18 | 0.03 |
| Sample 7 | 0.20 | 0.01 |
| Sample 8 | 0.20 | 0.02 |
| Sample 9 | 0.19 | 0.03 |
| Sample 10 | 0.19 | 0.04 |
| Sample 11 | 0.19 | 0.05 |
| Sample 12 | 0.21 | 0.03 |
| Sample 13 | 0.24 | 0.05 |
| Sample 14 | 0.29 | 0.05 |
| Sample 15 | 0.48 | 0.05 |
| Sample 16 | 0.20 | 0.00 |
| Sample 17 | 0.10 | 0.00 |
| Sample 18 | 0.00 | 0.00 |

In the case where an antiferroelectric substance in which spontaneous polarizations are alternately arranged, namely, a substance that undergoes an electric-field-induced phase transition, is used as a piezoelectric layer, an electric-field-induced phase transition occurs at a certain applied voltage or more and causes a large amount of strain. Therefore, it is possible to obtain a larger amount of strain than that in the case of the ferroelectric substance. However, driving does not occur at a certain voltage or less, and the amount of strain does not linearly change with respect to the voltage. The term "electric-field-induced phase transition" refers to a phase transition induced by an electric field and means a phase transition from an antiferroelectric phase to a ferroelectric phase, or a phase transition from a ferroelectric phase to an antiferroelectric phase. The ferroelectric phase is a state in which polarization axes are oriented in the same direction, and the antiferroelectric phase is a state in which polarization axes are alternately oriented. For example, in the phase transition from the antiferroelectric phase to the ferroelectric phase, the polarization axes alternately oriented in the antiferroelectric phase are rotated by 180 degrees such that the polarization axes are oriented in the same direction to produce a ferroelectric phase. Strain caused by lattice expansion or contraction due to such an electric-field-induced phase transition corresponds to phase transition strain due to an electric-field-induced phase transition. The substance that undergoes such an electric-field-induced phase transition is an antiferroelectric substance. In other words, in the antiferroelectric substance, polarization axes are alternately oriented in the absence of an electric field, and the polarization axes are rotated by an electric field so as to be oriented in the same direction. In such an antiferroelectric substance, in the P-V curve which shows the relationship between polarization P of the antiferroelectric substance and voltage V, double hysteresis having two hysteresis loop shapes in the positive and negative electric field directions is observed. The region where the polarization sharply changes corresponds to a phase transition region from the ferroelectric phase to the antiferroelectric phase or a phase transition region from the antiferroelectric phase to the ferroelectric phase.

On the other hand, in the ferroelectric substance, unlike the antiferroelectric substance, the P-V curve does not have double hysteresis, and the polarization direction is aligned in one direction, and thereby the amount of strain linearly changes with respect to the applied voltage. Consequently, since the amount of strain can be controlled easily, the size of ink droplets to be ejected and the like can be easily controlled. Therefore, both small-amplitude vibration that produces microvibration and large-amplitude vibration that produces a large excluded volume can be produced by one piezoelectric element.

In the piezoelectric layer 70, when measured by powder X-ray diffractometry, preferably, the diffraction peak belonging to the phase exhibiting ferroelectricity (ferroelectric phase) and the diffraction peak belonging to the phase exhibiting antiferroelectricity (antiferroelectric phase) are observed at the same time in the diffraction pattern. When a piezoelectric layer 70 in which the diffraction peak belonging to the phase exhibiting ferroelectricity and the diffraction peak belonging to the phase exhibiting antiferroelectricity are observed at the same time, namely, which has a composition at the morphotropic phase boundary (MPB) between the antiferroelectric phase and the ferroelectric phase is selected, it is possible to produce a piezoelectric element having a large amount of strain. Furthermore, in the piezoelectric layer 70, in general formula (1) above, preferably $0.17 \leq x \leq 0.20$, and more preferably $0.19 \leq x \leq 0.20$. In this range, when measured by powder X-ray diffractometry, the diffraction peak belonging to the phase exhibiting ferroelectricity (ferroelectric phase) and the diffraction peak belonging to the phase exhibiting antiferroelectricity (antiferroelectric phase) are observed at the same time, thus showing the antiferroelectric phase and the ferroelectric phase at the same time. Consequently, because of the presence of the MPB between the antiferroelectric phase and the ferroelectric phase, it is possible to produce a piezoelectric element having a large amount of strain.

Furthermore, the piezoelectric material constituting the piezoelectric layer 70 may contain bismuth potassium titanate or barium titanate having the perovskite structure. For example, when a piezoelectric material containing barium titanate having the perovskite structure is selected, piezoelectricity (amount of strain) can be improved. In the case where the piezoelectric material contains bismuth potassium titanate or barium titanate, Bi, K, and Ba are located at the A site, and Ti is located at the B site, and a composite oxide containing Bi and Fe, such as bismuth iron manganese oxide, may form a solid solution with bismuth potassium titanate or barium titanate.

A lead electrode 90, for example, composed of gold (Au) or the like, is connected to the second electrode 80 which is an individual electrode of each piezoelectric element 300, the lead electrode 90 being led from the vicinity of an ink supply passage 14 side end of the second electrode 80 and extending onto the titanium oxide layer 56.

A protective substrate 30 having a reservoir portion 31 constituting at least a part of a reservoir 100 is bonded by an adhesive 35 onto the passage-forming substrate 10 provided with the piezoelectric element 300, i.e., onto the first electrode 60, the titanium oxide layer 56, and the lead electrode 90. In this embodiment, the reservoir portion 31 passes through the protective substrate 30 in the thickness direction and extends in the width direction of the pressure-generating chamber 12. As described above, the reservoir portion 31 communicates with a communicating portion 13 of the passage-forming substrate 10 to constitute a reservoir 100 that serves as a common ink chamber for the pressure-generating chambers 12. The communicating portion 13 of the passage-forming substrate 10 may be divided into portions corresponding to the respective pressure-generating chambers 12, and the reservoir portion 31 only may constitute a reservoir. Furthermore, for example, it may be possible to configure such that pressure-generating chambers 12 only are provided in the passage-forming substrate 10, and ink supply passages 14 that communicate between the reservoir 100 and the individual pressure-generating chambers 12 are provided in a member lying between the passage-forming substrate 10 and the protective substrate 30 (e.g., the elastic film 50, the titanium oxide layer 56, or the like).

Furthermore, a piezoelectric element holding portion 32 is provided in a region of the protective substrate 30 facing the piezoelectric element 300, the piezoelectric element holding portion 32 having a space that does not hinder the movement of the piezoelectric element 300. As long as the piezoelectric element holding portion 32 has a space that does not hinder the movement of the piezoelectric element 300, the space may be sealed or may not be sealed.

It is preferable that as the material for the protective substrate 30, a material having substantially the same coefficient of thermal expansion as that of the passage-forming substrate 10, such as glass or a ceramic material, is used. In this embodiment, the protective substrate 30 is formed using a silicon single crystal substrate, which is the same material as that for the passage-forming substrate 10.

Furthermore, a through-hole 33 that passes through the protective substrate 30 in the thickness direction is formed in the protective substrate 30. The end and its vicinity of the lead electrode 90 led from each piezoelectric element 300 are exposed to the inside of the through-hole 33.

Furthermore, a driving circuit 120 that is used for driving the piezoelectric elements 300 arranged in parallel to one another is fixed on the protective substrate 30. As the driving circuit 120, for example, a circuit board, a semiconductor integrated circuit (IC), or the like may be used. The driving circuit 120 and the lead electrode 90 are electrically connected to each other through a connection wiring 121 composed of a conductive wire, such as a bonding wire.

A compliance substrate 40 including a sealing film 41 and a fixing plate 42 is bonded onto the protective substrate 30. The sealing film 41 is composed of a flexible material that has low rigidity, and one side face of the reservoir portion 31 is sealed by the sealing film 41. The fixing plate 42 is composed of a relatively hard material. An area of the fixing plate 42 facing the reservoir 100 is an opening portion 43 that is completely removed in the thickness direction, and therefore, one side face of the reservoir 100 is sealed only by the flexible sealing film 41.

In the ink jet recording head I according to this embodiment, the inside is filled with ink from the reservoir 100 up to the nozzle openings 21 by receiving ink from an ink inlet that is connected to external ink supplying means, not shown. Then, a voltage is applied between the first electrode 60 and the second electrode 80 corresponding to each pressure-generating chamber 12 in accordance with a recording signal from the driving circuit 120 so that the elastic film 50, the titanium oxide layer 56, the first electrode 60, and the piezoelectric layer 70 are subjected to deflection deformation. As a result, the pressure inside each pressure-generating chamber 12 is increased, and ink droplets are ejected from the nozzle opening 21.

Next, an example of a method for manufacturing an ink jet recording head according to this embodiment will be described with reference to FIGS. 19A to 23B. Note that FIGS. 19A to 23B are cross-sectional views taken in the longitudinal direction of the pressure-generating chamber.

Figure 19A:
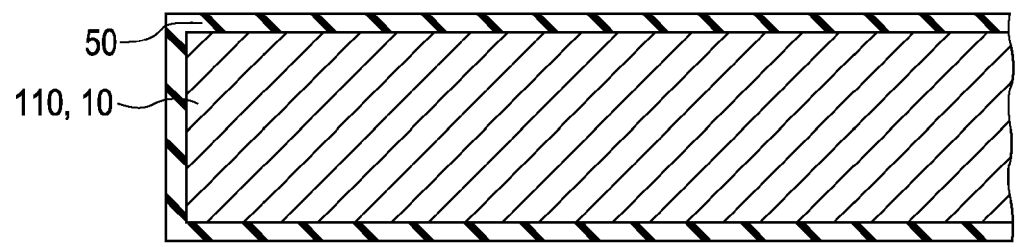
FIGS. 19A and 19B are cross-sectional views showing manufacturing process steps of a recording head according to the first embodiment.

First, as shown in FIG. 19A, a silicon dioxide film composed of silicon dioxide ($SiO_2$) or the like constituting an elastic film 50 composed of a material containing silicon is formed, by thermal oxidation or the like, on a surface of a wafer (110) for passage-forming substrate, which is a silicon wafer.

Figure 19B:
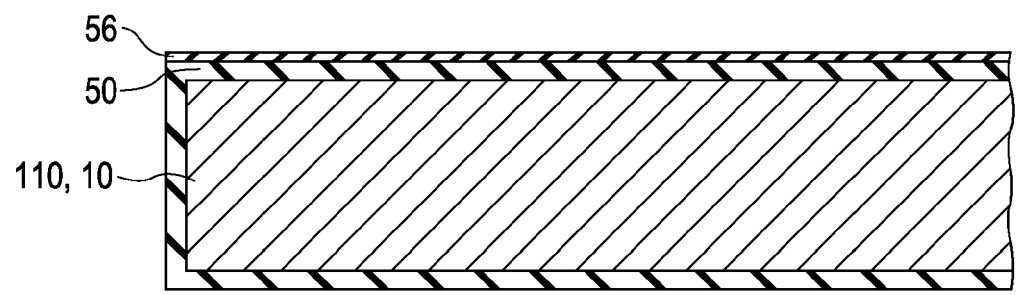

Next, as shown in FIG. 19B, a titanium oxide layer 56 composed of titanium oxide is formed on the elastic film 50 (silicon dioxide film). Specifically, for example, after a titanium film is formed by sputtering, the titanium film is thermally oxidized using a rapid thermal annealing (RTA) apparatus or the like, for example, at about 700° C. to 750° C. so as to be crystallized. Thereby, the titanium oxide layer 56 composed of titanium oxide is formed.

Figure 20A:
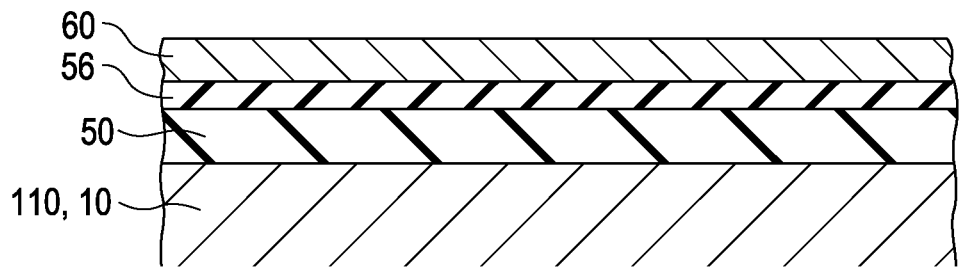
FIGS. 20A to 20C are cross-sectional views showing manufacturing process steps of the recording head according to the first embodiment.

Next, as shown in FIG. 20A, a first electrode 60 composed of platinum is formed by DC sputtering or the like over the entire surface of the titanium oxide layer 56, followed by patterning.

Next, a piezoelectric layer 70 is formed on the first electrode 60. The method for forming the piezoelectric layer 70 is not particularly limited. For example, the piezoelectric layer 70 may be formed using a chemical solution method, such as a metal-organic decomposition (MOD) method in which a solution obtained by dissolving/dispersing an organometallic compound in a solvent is applied and dried, followed by firing at a high temperature to obtain a piezoelectric layer 70 composed of a metal oxide, or a sol-gel method. Besides, a liquid phase method or a solid phase method, such as laser ablation, sputtering, pulsed laser deposition (PLD), CVD, or aerosol deposition, may be used.

Figure 20B:
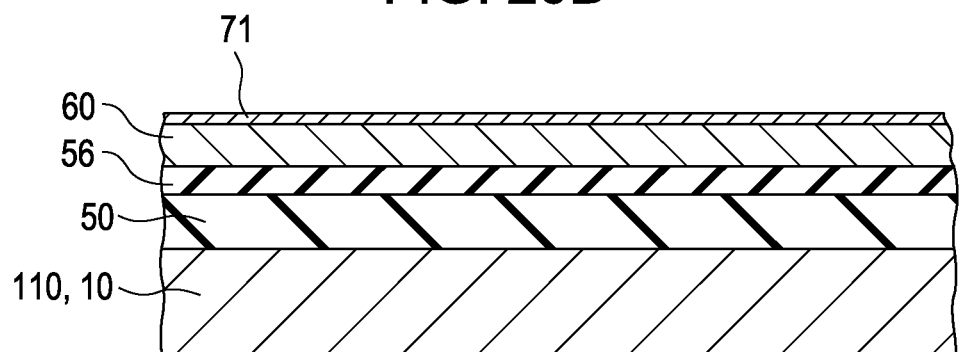

An example of a specific method for forming the piezoelectric layer 70 will be described. First, as shown in FIG. 20B, a sol or a MOD solution (precursor solution) containing organometallic compounds, specifically, Bi and Fe, La, Mn, Ti, Ba, and K, which are added as required, in amounts that will achieve the desired compositional ratio, is applied by spin coating or the like onto the first electrode 60 to form a piezoelectric precursor film 71 (application step).

The precursor solution to be applied is obtained by mixing organometallic compounds containing Bi, and Fe, La, Mn, Ti, Ba, and K, which are added as required, such that the desired molar ratio of the metals is achieved, and dissolving or dispersing the resulting mixture using an organic solvent, such as alcohol. As the organometallic compounds containing Bi, Fe, La, Mn, Ti, Ba, and K, for example, metal alkoxides, organic acid salts, and β-diketone complexes can be used. Examples of organometallic compounds containing Bi include bismuth 2-ethylhexanoate. Examples of organometallic compounds containing Fe include iron 2-ethylhexanoate. Examples of organometallic compounds containing La include lanthanum 2-ethylhexanoate. Examples of organometallic compounds containing Mn include manganese 2-ethylhexanoate. Examples of organometallic compounds containing Ti include titanium isopropoxide, titanium 2-ethylhexanoate, and titanium (di-1-propoxide) bis(acetylacetonate). Examples of organometallic compounds containing Ba include barium isopropoxide, barium 2-ethylhexanoate, and barium acetylacetonate. Examples of organometallic compounds containing K include potassium 2-ethylhexanoate, potassium acetate, and potassium acetylacetonate.

Next, the piezoelectric precursor film 71 is heated to a predetermined temperature and dried for a certain period of time (drying step). Next, the dried piezoelectric precursor film 71 is heated to a predetermined temperature and held for a certain period of time to perform degreasing (degreasing step). Here, the degreasing means eliminating organic components contained in the piezoelectric precursor film 71, for example, as $NO_2$, $CO_2$, $H_2O$, or the like.

Figure 20C:
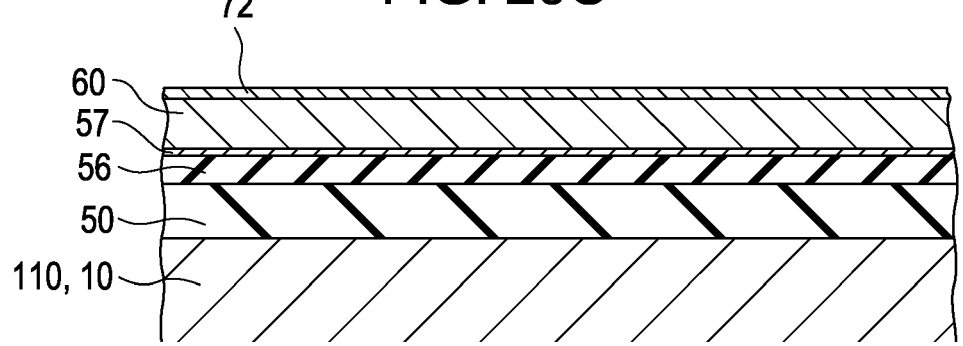

Next, as shown in FIG. 20C, the piezoelectric precursor film 71 is heated to a predetermined temperature, for example, about 600° C. to 800° C. and held for a certain period of time to perform crystallization, and thereby, a piezoelectric film 72 is formed (firing step).

Examples of the heating apparatus used in the drying step, the degreasing step, and the firing step include a rapid thermal annealing (RTA) apparatus in which heating is performed by irradiation with an infrared lamp and a hot plate.

Figure 21A:
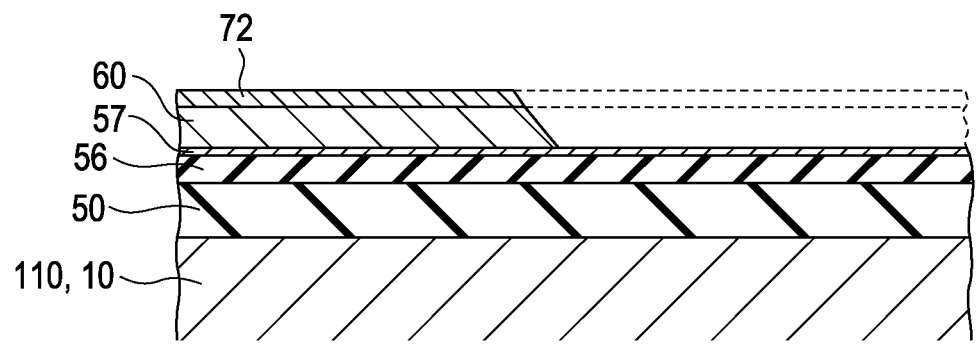
FIGS. 21A and 21B are cross-sectional views showing manufacturing process steps of the recording head according to the first embodiment.

Next, as shown in FIG. 21A, using a resist layer (not shown) having a predetermined shape placed on the piezoelectric film 72 as a mask, the first electrode 60 and the first layer of the piezoelectric film 72 are subjected to patterning at the same time such that the side faces thereof are inclined.

Figure 21B:
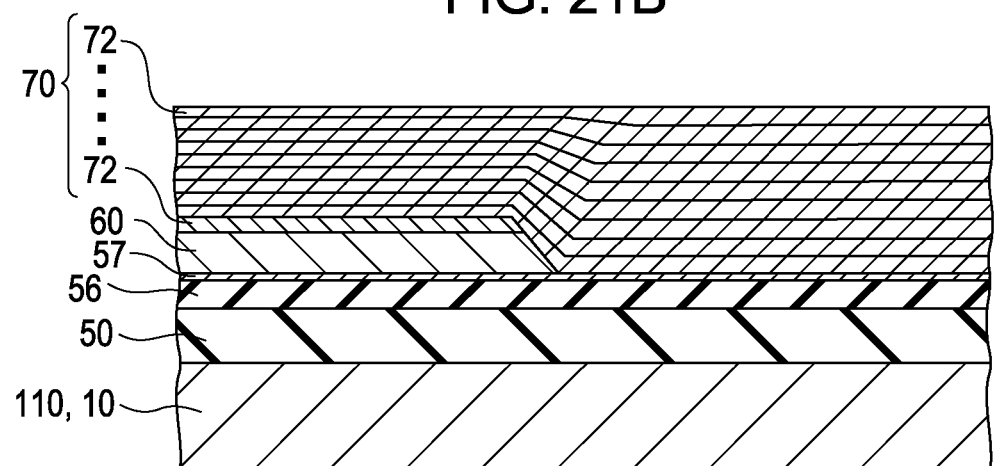

Next, after the resist layer is removed, by repeating the application step, the drying step, and the degreasing step, or the application step, the drying step, the degreasing step, and the firing step a plurality of times according to the desired thickness or the like, a piezoelectric layer 70 including a plurality of piezoelectric films 72 is formed. Thereby, as shown in FIG. 21B, a piezoelectric layer 70 including a plurality of piezoelectric films 72 with a predetermined thickness is obtained. For example, in the case where the thickness for each application of the solution is about 0.1 μm, the total thickness of the piezoelectric layer 70, for example, including ten piezoelectric films 72 is about 1.1 μm. Although piezoelectric films 72 are stacked in this embodiment, one piezoelectric film only may be used.

In the process of forming the piezoelectric layer 70, when the piezoelectric precursor film 71 is crystallized by firing, Bi contained in the piezoelectric material (piezoelectric precursor film 71) diffuses toward the vibration plate (elastic film 50) composed of a material containing silicon. It is assumed that Bi contained in the piezoelectric material passes through the grain boundaries of platinum constituting the first electrode 60 and diffuses into the titanium oxide layer 56.

Since Bi contained in the piezoelectric material passes through the first electrode 60 composed of platinum and diffuses toward the vibration plate (elastic film 50) composed of a material containing silicon, in the existing art, displacement characteristics, durability, and other properties of the vibration plate tend to be degraded presumably because diffused Bi enters the vibration plate and bonds with Si in the vibration plate. Even if a titanium film composed of titanium is provided between the first electrode 60 and the vibration plate (elastic film 50), it is not possible to prevent Bi from diffusing into the vibration plate presumably because the diffusion rate of titanium is high in the firing step. However, in this embodiment, the titanium oxide layer 56 is present when diffusion of Bi occurs, and the titanium oxide layer 56 prevents Bi from diffusing into the vibration plate (elastic film 50). Consequently, diffusion of Bi stops at the first electrode 60 side of the titanium oxide layer 56, and Bi becomes segregated at the first electrode 60 side of the titanium oxide layer 56. Thereby, a bismuth-containing layer 57 containing Bi is formed. That is, diffusion of Bi contained in the piezoelectric material is prevented by the titanium oxide layer 56 and the bismuth-containing layer 57 formed in the firing step or the like. Consequently, Bi is prevented from diffusing into the vibration plate, and it is possible to obtain a vibration plate which does not contain Bi.

After the piezoelectric layer 70 is formed as described above, as shown in FIG. 22A, a second electrode 80 composed of platinum or the like is formed by sputtering or the like on the piezoelectric layer 70. The piezoelectric layer 70 and second electrode 80 are subjected to patterning at the same time in a region facing each pressure-generating chamber 12 thereby to form a piezoelectric element 300 including the first electrode 60, the piezoelectric layer 70, and the second electrode 80. The patterning of the piezoelectric layer 70 and the second electrode 80 can be performed at one time by dry etching through a resist layer (not shown) formed in a predetermined shape. Subsequently, as necessary, post-annealing may be performed in a temperature range of 600° C. to 800° C. Thereby, it is possible to form a good interface between the piezoelectric layer 70 and the first electrode 60 or the second electrode 80, and crystallinity of the piezoelectric layer 70 can be improved.

Figure 22A:
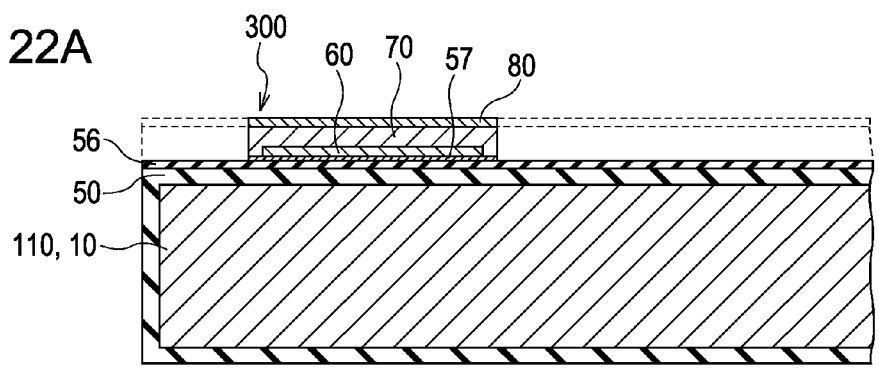
FIGS. 22A to 22C are cross-sectional views showing manufacturing process steps of the recording head according to the first embodiment.
Figure 22B:
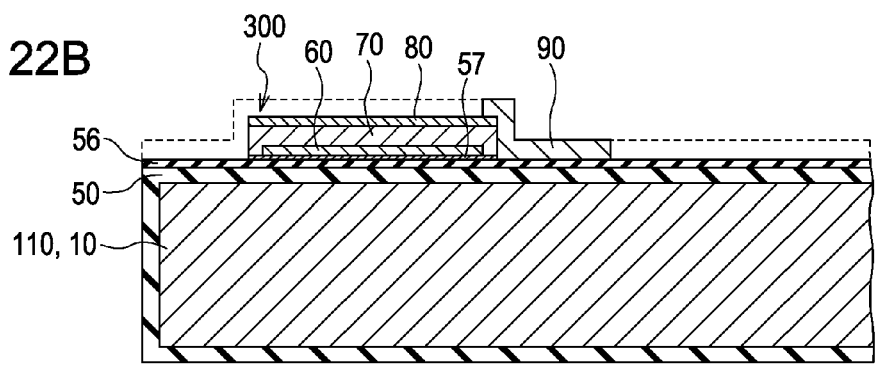

Next, as shown in FIG. 22B, a lead electrode 90 composed of gold (Au) or the like is formed over the entire surface of the wafer 110 for passage-forming substrate, and then patterning of the lead electrode 90 is performed for each piezoelectric element 300 through a mask pattern composed of a resist or the like (not shown).

Figure 22C:
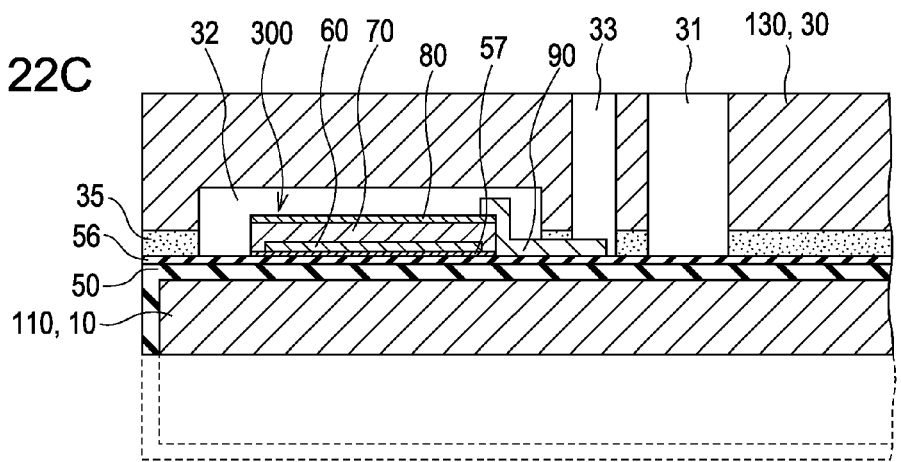

Next, as shown in FIG. 22C, a wafer 130 protective substrate for forming a plurality of protective substrates 30, which is a silicon wafer, is bonded to the piezoelectric element 300 side of the wafer 110 for passage-forming substrate with an adhesive 35 therebetween, and then the thickness of the wafer 110 for passage-forming substrate is decreased to a predetermined thickness.

Figure 23A:
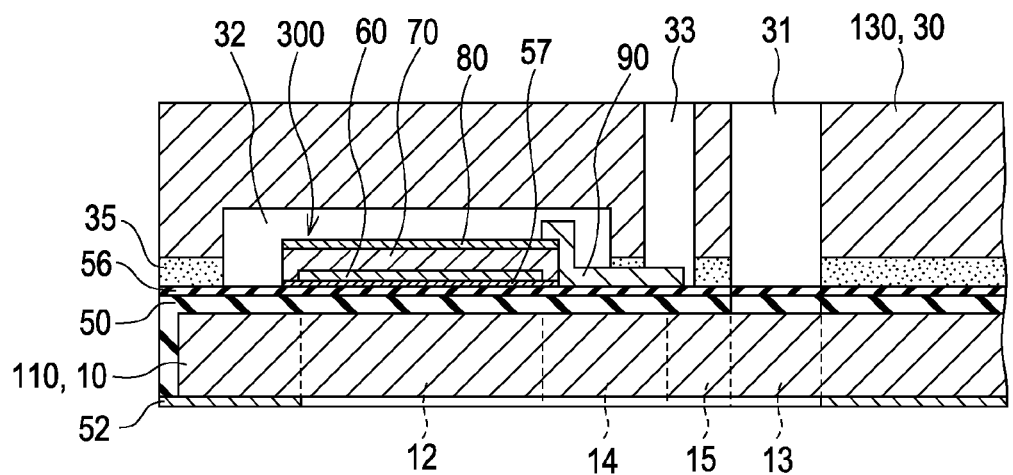
FIGS. 23A and 23B are cross-sectional views showing manufacturing process steps of the recording head according to the first embodiment.

Next, as shown in FIG. 23A, a mask film 52 is newly formed on the wafer 110 for passage-forming substrate and is subjected to patterning in a predetermined shape.

Figure 23B:
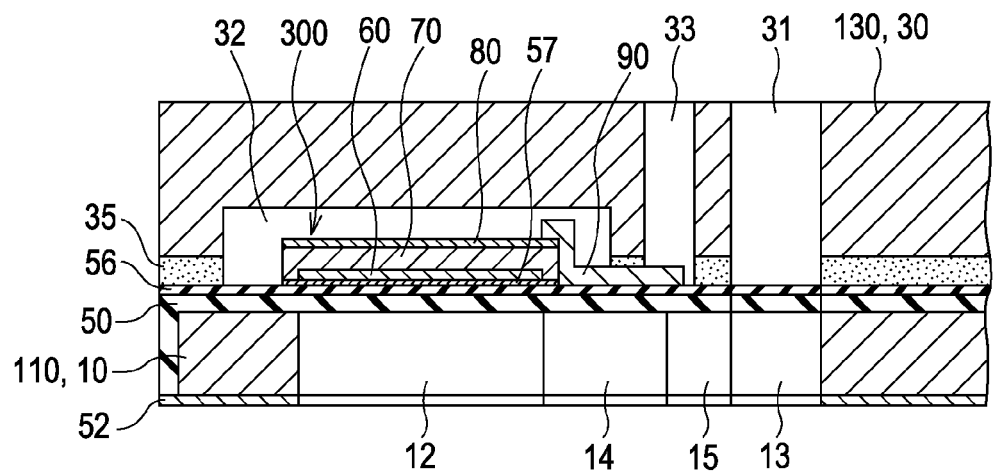

Subsequently, as shown in FIG. 23B, the wafer 110 for passage-forming substrate is subjected to anisotropic etching (wet etching) using an alkali solution, such as KOH, through the mask film 52. Thereby, a pressure-generating chamber 12, a communicating portion 13, an ink supply passage 14, a communicating passage 15, and the like corresponding to the piezoelectric element 300 are formed.

Next, unnecessary outer peripheral portions of the wafer 110 for passage-forming substrate and the wafer 130 for protective substrate are removed by cutting, for example, by dicing. Then, after the mask film 52 on the side opposite the wafer 130 side of the wafer 110 for passage-forming substrate is removed, a nozzle plate 120 having nozzle openings 21 formed by punching is bonded thereto, and a compliance substrate 40 is bonded to the wafer 130 for protective substrate. By dividing the wafer 110 for passage-forming substrate and the like into chip-size passage-forming substrates 10 and the like, an ink jet recording head I of this embodiment is obtained.

EXAMPLES

The invention will be described in more detail on the basis of the examples below. However, it is to be understood that the invention is not limited to the examples.

Example 1

First, a silicon dioxide film with a thickness of 1,070 nm was formed by thermal oxidation on a surface of a (100)-oriented silicon substrate. Next, a titanium film with a thickness of 40 nm was formed by RF sputtering on the silicon dioxide film, followed by thermal oxidation, to form a titanium oxide film (titanium oxide layer). A platinum film with a thickness of 130 nm was formed by DC sputtering on the titanium oxide film, and thereby a (111)-oriented first electrode was obtained.

Next, a piezoelectric layer was formed by spin coating on the first electrode by the method described below. First, a precursor solution was prepared by mixing xylene/octane solutions of bismuth 2-ethylhexanoate, lanthanum 2-ethylhexanoate, iron 2-ethylhexanoate, and manganese 2-ethylhexanoate at a predetermined ratio. The precursor solution was dropped onto the substrate provided with the titanium oxide film and the first electrode, and by rotating the substrate at 1,500 rpm, a piezoelectric precursor film was formed (application step). Next, drying and degreasing were performed at 350° C. for three minutes (drying and degreasing step). The application step and drying and degreasing step were repeated three times, and then firing was performed by rapid thermal annealing (RTA) at 650° C. for three minutes in a nitrogen atmosphere (nitrogen was made to flow in the heating apparatus at a flow rate of 100 cc/min) (firing step). The process in which the application step and the drying and degreasing step were repeated three times and the firing step of firing at one time was repeated four times, and by 12 application steps in total, a piezoelectric layer with a total thickness of 460 nm was formed.

Then, a platinum film, as a second electrode, with a thickness of 100 nm was formed by DC sputtering on the piezoelectric layer, followed by firing using RTA at 650° C. for five minutes. Thereby, a piezoelectric element including a piezoelectric layer composed of bismuth lanthanum iron manganese oxide (($Bi_{0.85}$, $La_{0.15}$) ($Fe_{0.97}$, $Mn_{0.03}$) $O_3$) having the perovskite structure was obtained.

Example 2

The same procedure was performed as in Example 1 except that, instead of forming a piezoelectric layer with a total thickness of 460 nm by 12 application steps in total, a piezoelectric layer with a total thickness of 87 nm was formed by repeating the process including the application step, the drying and degreasing step, and the firing step twice, i.e., two application steps in total.

Example 3

The same procedure was performed as in Example 2 except that, by using a precursor solution prepared by mixing xylene/octane solutions of bismuth 2-ethylhexanoate, iron 2-ethylhexanoate, manganese 2-ethylhexanoate, barium 2-ethylhexanoate, and titanium 2-ethylhexanoate at a predetermined ratio, a piezoelectric layer composed of barium titanate-containing bismuth iron manganese oxide ($0.8[Bi(Fe_{0.97}, Mn_{0.03})O_3]$–$0.2[BaTiO_3]$) and having a thickness of 143 nm was obtained.

Example 4

The same procedure was performed as in Example 2 except that, by using a precursor solution prepared by mixing xylene/octane solutions of bismuth 2-ethylhexanoate, iron 2-ethylhexanoate, and manganese 2-ethylhexanoate and a butanol solution in which potassium and titanium were dissolved at a predetermined ratio, a piezoelectric layer composed of bismuth potassium titanate-containing bismuth iron manganese oxide ($0.61[Bi(Fe_{0.97}, Mn_{0.03})O_3]$-$0.39[(Bi,K)TiO_3]$) and having a thickness of 186 nm was obtained.

Experimental Example 1

In each of the piezoelectric elements of Examples 1 to 4, the powder X-ray diffraction pattern of the piezoelectric layer was measured with a D8 Discover manufactured by Bruker AXS, using CuKα radiation as an X-ray source, at room temperature. As a result, in all of Examples 1 to 4, only the peak derived from the $ABO_3$ type structure and the peak derived from the substrate are observed, and peaks resulting from other different phases are not observed.

Experimental Example 2

Figure 24:
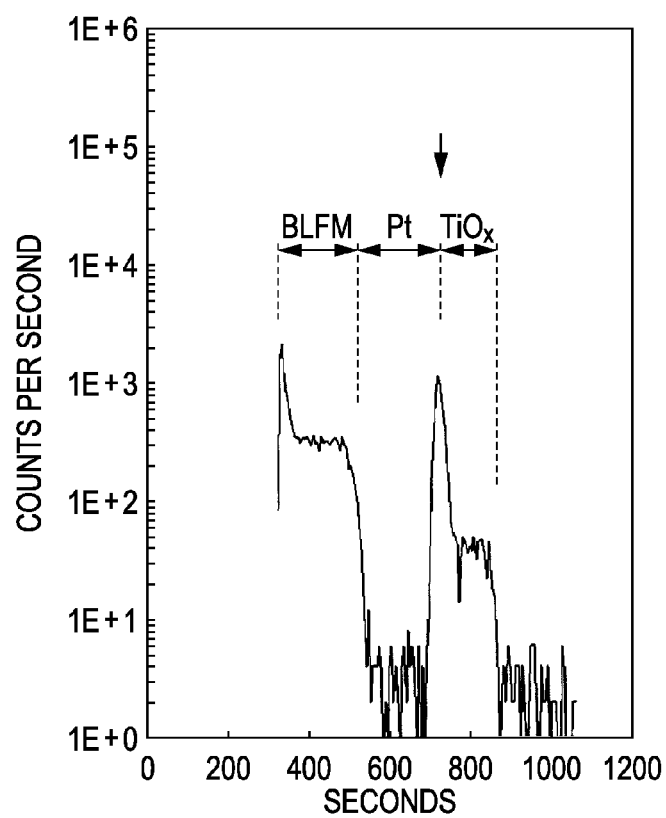
FIG. 24 is a graph showing the SIMS measurement results of Example 2.
Figure 25:
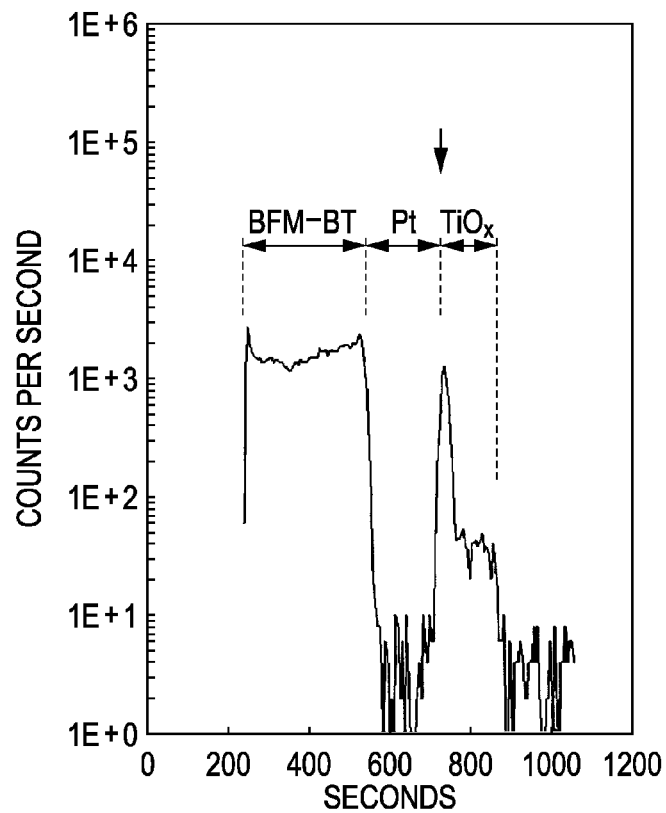
FIG. 25 is a graph showing the SIMS measurement results of Example 3.
Figure 26:
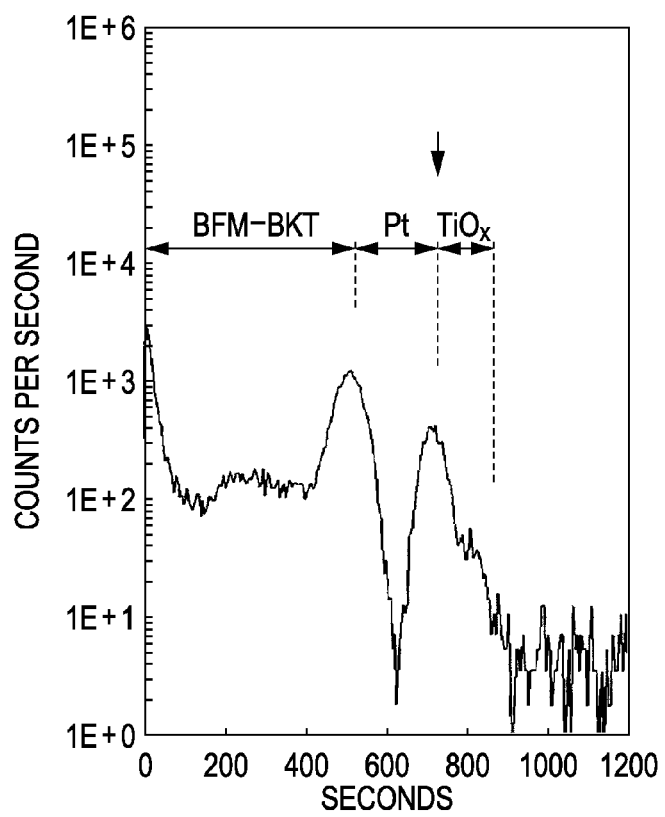
FIG. 26 is a graph showing the SIMS measurement results of Example 4.
Figure 27:
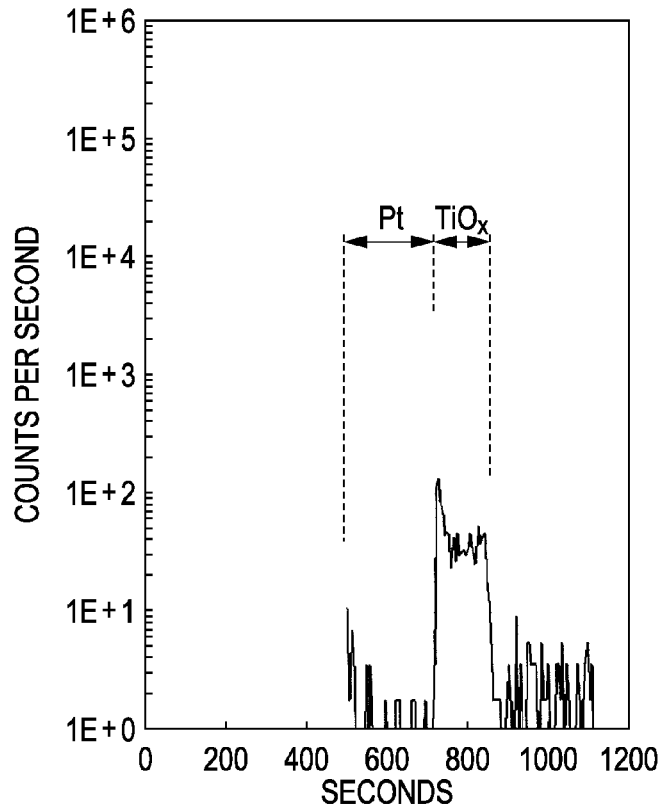
FIG. 27 is a graph showing the SIMS measurement results in a state in which no piezoelectric layer is provided.

In each of the piezoelectric elements of Examples 2 to 4, the state of bismuth was examined by performing secondary ion mass spectrometry from the piezoelectric layer along the thickness direction. As the secondary ion mass spectrometer (SIMS), an ADEPT-1010 manufactured by ULVAC-PHI, Inc. was used. FIG. 24 shows the results of Example 2, FIG. 25 shows the results of Example 3, and FIG. 26 shows the results of Example 4. The example in which no piezoelectric layer was disposed was measured in the same manner, and the results thereof are shown in FIG. 27.

In FIGS. 24 to 27, bismuth lanthanum iron manganese oxide constituting the piezoelectric layer of Example 2 is denoted by BLFM, barium titanate-containing bismuth iron manganese oxide constituting the piezoelectric layer of Example 3 is denoted by BFM-BT, bismuth potassium titanate-containing bismuth iron manganese oxide constituting the piezoelectric layer of Example 4 is denoted by BFM-BKT, the first electrode composed of platinum is denoted by Pt, and the titanium oxide layer is denoted by $TiO_x$. The vertical axis represents the detected intensity normalized at $^{16}O+^{133}Cs$, and the horizontal axis represents the reverse sputtering time, in which the sputtering time corresponds to the depth direction. Although bismuth signals are observed in the $TiO_x$ layer of the example including only the first electrode composed of platinum in which bismuth is not present, this is caused by interference of interfering ions, such as $^{48}Ti_3+^{49}Ti+^{16}O$, on $^{209}Bi$, and the signals observed in the first electrode composed of platinum can be considered as a background. In addition, because of the substrate effect, the intensity cannot be compared between different layers. However, the intensity can be compared within a layer.

As shown in FIGS. 24 to 26, in comparison with FIG. 27, in FIGS. 24 to 26, as indicated by the arrow, a large amount of bismuth is detected at the interface between the first electrode composed of platinum and the titanium oxide layer, and no bismuth is detected in the layers below, specifically, in the silicon dioxide film and the titanium oxide layer. The reason for this is that bismuth diffused in the first electrode direction during firing is prevented from diffusing further by the titanium oxide layer. In other words, the titanium oxide layer functions as a diffusion prevention layer with respect to bismuth. On the other hand, in the case where a titanium film is provided instead of a titanium oxide film, since diffusion of bismuth cannot be prevented during firing, bismuth enters the silicon dioxide film which is the vibration plate.

Experimental Example 3

Figure 28:
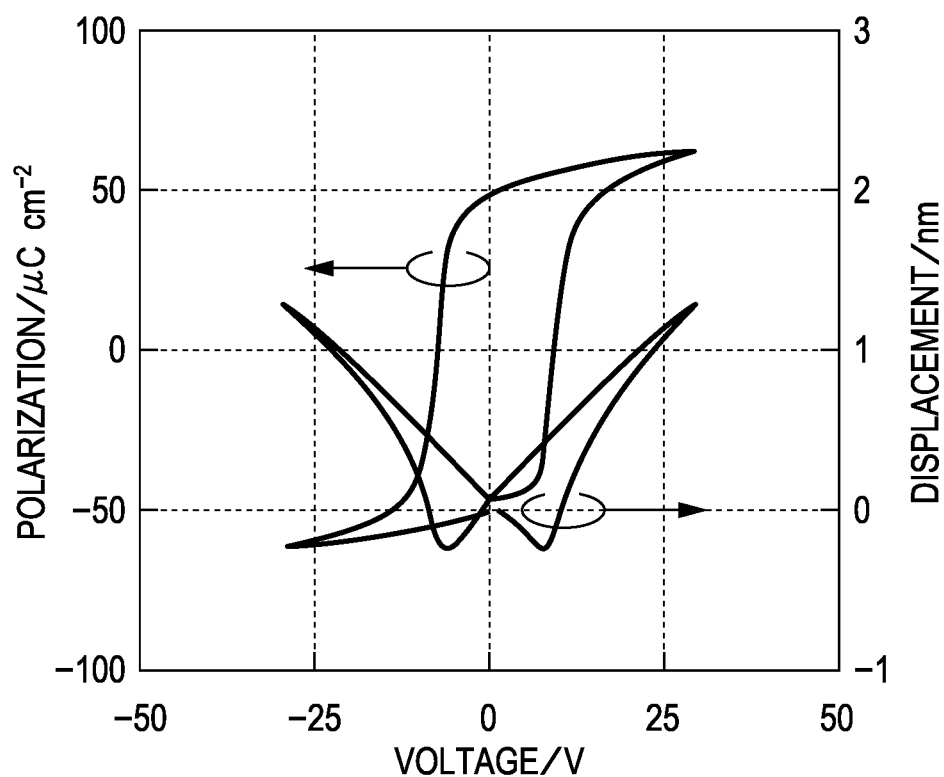
FIG. 28 is a graph showing the P-V curve and the S-V curve of Example 1.

In the piezoelectric element of Example 1, the relationship between the electric-field-induced strain and the electric field intensity was measured using a displacement measurement apparatus (DBLI) manufactured by aixACCT Systems, Inc., at room temperature, in which an electrode pattern (φ=500 μm) was used, and a voltage with a frequency of 1 kHz was applied. As a result, as shown in FIG. 28, ferroelectricity is exhibited.

Other Embodiments

An embodiment of the invention has been described above. However, the basic configuration according to the invention is not limited thereto. For example, in the embodiment described above, a silicon single crystal substrate is exemplified as the passage-forming substrate 10. However, the invention is not limited thereto. For example, a material, such as a SOI substrate or glass, may be used.

Figure 29:
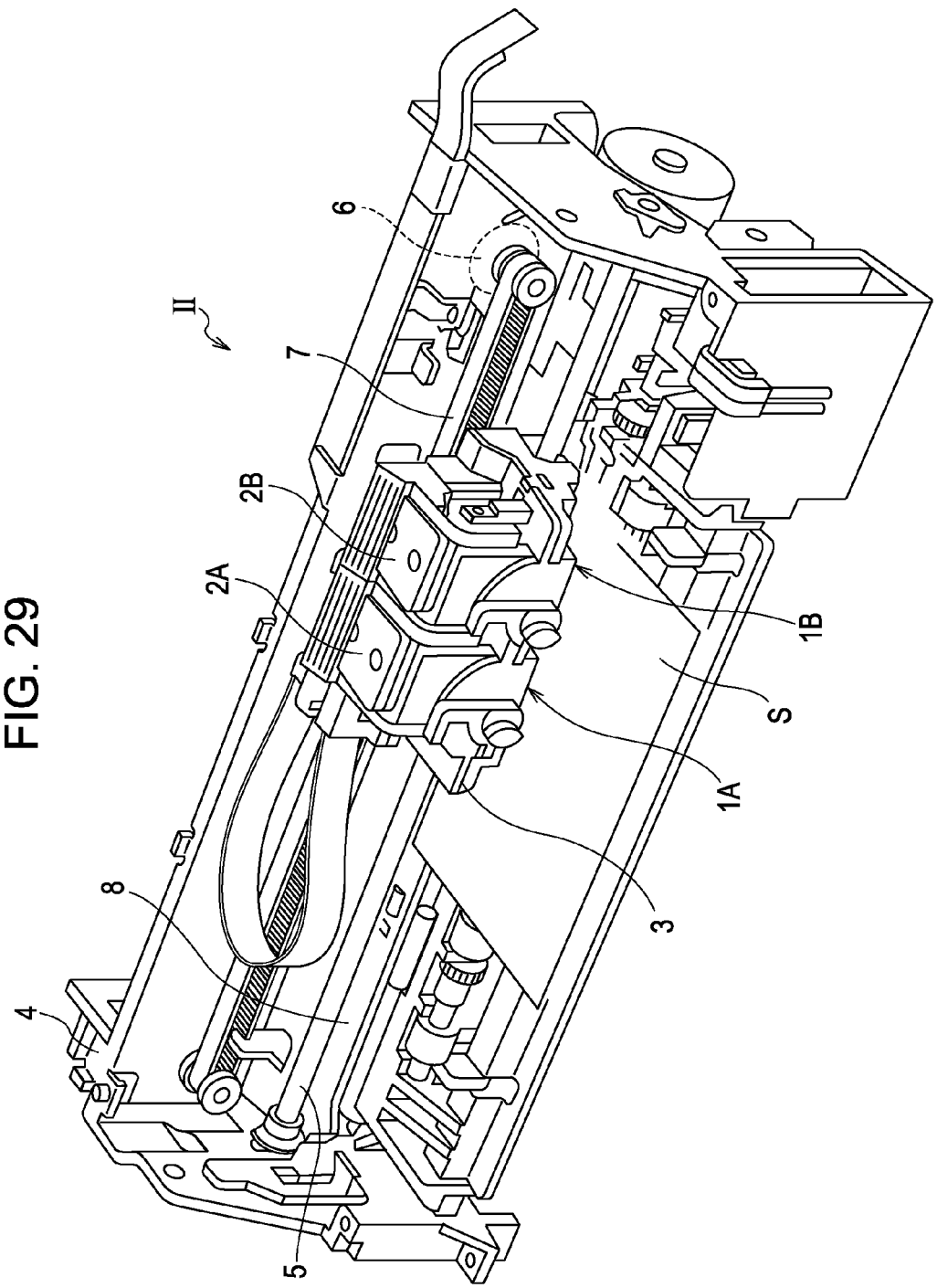
FIG. 29 is a perspective view schematically showing a structure of a recording apparatus according to an embodiment of the invention.

Furthermore, the ink jet recording head according to any of the embodiments described above constitutes a part of a recording head unit that includes an ink flow passage communicating with an ink cartridge or the like and is mounted in an ink jet recording apparatus. FIG. 29 is a perspective view schematically showing an example of the ink jet recording apparatus.

In an ink jet recording apparatus II shown in FIG. 29, cartridges 2A and 2B constituting ink supplying means are detachably mounted in recording head units 1A and 1B having ink jet recording heads I. A carriage 3 in which the recording head units 1A and 1B are mounted is provided on a carriage shaft 5, which is fixed to an apparatus main body 4, so as to be freely movable along the shaft direction. The recording head units 1A and 1B are, for example, configured to eject a black ink composition and a color ink composition, respectively.

When the driving force of a driving motor 6 is conveyed to the carriage 3 through a plurality of gears, not shown, and a timing belt 7, the carriage 3 in which the recording head units 1A and 1B are mounted is moved along the carriage shaft 5. Meanwhile, a platen 8 is provided in the apparatus main body 4 so as to extend along the carriage shaft 5. A recording sheet S which is a recording medium, such as paper, is fed by a paper feed roller or the like, not shown, and is transported while being wound around the platen 8.

In the embodiment described above, the ink jet recording head has been described as an example of a liquid ejecting head. The invention is directed broadly to liquid ejecting heads in general, and can also be applied to liquid ejecting heads that eject a liquid other than ink. Examples of other liquid ejecting heads include various recording heads used for image recording apparatuses, such as printers; coloring material ejecting heads used for manufacturing color filters for liquid crystal displays or the like; organic EL displays; electrode material ejecting heads used for forming electrodes for field emission displays (FEDs) or the like; and bio-organic substance ejecting heads for manufacturing biochips.

Furthermore, the invention is not limited to piezoelectric elements to be mounted in liquid ejecting heads, such as ink jet recording heads, but can also be applied to piezoelectric elements to be mounted in other apparatuses, such as ultrasonic devices, e.g., ultrasonic generators, ultrasonic motors, and pressure sensors. Furthermore, the invention can also be applied to ferroelectric elements, such as ferroelectric memories.

What is claimed is:

1. A liquid ejecting head comprising:
   a plate which is composed of a material containing silicon;
   a titanium oxide layer which is disposed above the plate;
   a bismuth-containing layer which is disposed above the titanium oxide layer and contains bismuth;
   a first electrode which is disposed above the bismuth-containing layer and is composed of platinum;
   a piezoelectric layer which is disposed above the first electrode and is composed of a piezoelectric material containing at least bismuth; and
   a second electrode which is disposed above the piezoelectric layer.

2. The liquid ejecting head according to claim 1, wherein the piezoelectric material contains bismuth and iron.

3. The liquid ejecting head according to claim 1, wherein the piezoelectric material contains bismuth, lanthanum, iron, and manganese.

4. The liquid ejecting head according to claim 1, wherein the piezoelectric material contains barium and titanium.

5. The liquid ejecting head according to claim 1, wherein the piezoelectric material contains bismuth, potassium, and titanium.

6. The liquid ejecting head according to claim 1, wherein the bismuth-containing layer has a thickness of 10 nm or less.

7. A liquid ejecting apparatus comprising the liquid ejecting head according to claim 1.

* * * * *